(12) United States Patent
Basler et al.

(10) Patent No.: US 11,588,048 B2
(45) Date of Patent: Feb. 21, 2023

(54) SEMICONDUCTOR DEVICE WITH INSULATED GATE TRANSISTOR CELL AND RECTIFYING JUNCTION

(71) Applicant: Infineon Technologies AG, Neubiberg (DE)

(72) Inventors: Thomas Basler, Chemnitz (DE); Hans-Guenter Eckel, Rostock (DE); Jan Fuhrmann, Rostock (DE); Dethard Peters, Hoechstadt (DE); Florian Stoermer, Rostock (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 43 days.

(21) Appl. No.: 17/186,281

(22) Filed: Feb. 26, 2021

(65) Prior Publication Data
US 2021/0273088 A1    Sep. 2, 2021

(30) Foreign Application Priority Data
Feb. 28, 2020   (EP) .................................... 20160168

(51) Int. Cl.
*H01L 29/78*   (2006.01)
*H01L 29/16*   (2006.01)
(Continued)

(52) U.S. Cl.
CPC ...... *H01L 29/7804* (2013.01); *H01L 29/1608* (2013.01); *H01L 29/405* (2013.01); *H01L 29/47* (2013.01); *H01L 29/7813* (2013.01)

(58) Field of Classification Search
CPC ............ H01L 29/7804; H01L 29/7806; H01L 29/1608; H01L 29/405; H01L 29/47;
(Continued)

(56) References Cited

U.S. PATENT DOCUMENTS

2012/0037955 A1*   2/2012   Hirler ................. H01L 29/7397
                                                                         257/140
2016/0247794 A1    8/2016   Vielemeyer et al.
(Continued)

FOREIGN PATENT DOCUMENTS

JP      S59 195840 U    12/1984
JP      2000223705 A    8/2000
JP      2011199141 A    10/2011

*Primary Examiner* — Syed I Gheyas
(74) *Attorney, Agent, or Firm* — Cooper Legal Group LLC

(57) ABSTRACT

In an example, a semiconductor device includes an insulated gate transistor cell, a first region (e.g., a drain region and/or a drift region), a cathode region, a second region (e.g., an anode region and/or a separation region), and a source electrode. The insulated gate transistor cell includes a source region and a gate electrode. The source region and the cathode region are in a silicon carbide body. The gate electrode and the cathode region are electrically connected. The cathode region, the source region, and the first region have a first conductivity type. The second region has a second conductivity type and is between the cathode region and the first region. The source electrode and the source region are electrically connected. The source electrode and the second region are in contact with each other. A rectifying junction is electrically coupled between the source electrode and the cathode region.

20 Claims, 13 Drawing Sheets

(51) Int. Cl.
  *H01L 29/40* (2006.01)
  *H01L 29/47* (2006.01)
(58) Field of Classification Search
  CPC ............. H01L 29/1095; H01L 21/8213; H01L 27/0255; H01L 27/0629
  See application file for complete search history.

(56) References Cited

U.S. PATENT DOCUMENTS

2018/0337171 A1  11/2018  Losee et al.
2020/0006544 A1  1/2020  Siemieniec et al.

* cited by examiner

SEMICONDUCTOR DEVICE WITH INSULATED GATE TRANSISTOR CELL AND RECTIFYING JUNCTION

RELATED APPLICATION

This application claims priority to European Patent Application No. 20160168.9, filed on Feb. 28, 2020, entitled "SEMICONDUCTOR DEVICE WITH INSULATED GATE TRANSISTOR CELL AND RECTIFYING JUNCTION", which is incorporated by reference herein in its entirety.

TECHNICAL FIELD

Examples of the present disclosure relate to a semiconductor device with insulated gate transistor cell, for example to a semiconductor device with an insulated gate transistor cell and a rectifying junction between gate electrode and source electrode of the insulated gate transistor.

BACKGROUND

One aspect to be considered for MOSFETs (metal oxide semiconductor field effect transistors) is the drift of gate threshold voltage VGS(th) under long-term operation. A dynamic component of the gate threshold voltage drift may depend on the switching frequency and the selected gate-to-source voltage for turn-off VGS(off). For example, negative voltages at the gate terminal may accelerate a gate threshold voltage drift. Design guidelines aiming at limiting the increase of SiC MOSFET on-state resistance RDS(on) recommend a certain operating area for the minimum turn-off voltage VGS(off), the switching frequency and the turn-on voltage VGS(on).

There is a need for reducing long-term gate threshold voltage drift of semiconductor devices at low circuit complexity.

SUMMARY

An embodiment of the present disclosure relates to a semiconductor device. The semiconductor device includes an insulated gate transistor cell, a first region, a cathode region, a second region, and a source electrode. The first region includes a drain region and/or a drift region. The second region includes an anode region and/or a separation region. The insulated gate transistor cell includes a source region and a gate electrode. The source region is formed in a silicon carbide body. The cathode region is formed in the silicon carbide body. The gate electrode and the cathode region are electrically connected. The cathode region, the source region, and the first region have a first conductivity type. The second region has a second conductivity type and is formed between the cathode region and the first region. The source electrode and the source region are electrically connected. The source electrode and the second region are in contact with each other. A rectifying junction is electrically coupled between the source electrode and the cathode region.

In an embodiment, a semiconductor device includes an insulated gate transistor cell, a first region, a cathode region, a second region, and a source electrode. The first region includes a drain region and/or a drift region. The second region includes an anode region and/or a separation region. The insulated gate transistor cell includes a source region and a gate electrode. The source region is formed in a silicon carbide body. The cathode region is formed in the silicon carbide body. The gate electrode and the cathode region are electrically connected. The cathode region, the source region, and the first region have a first conductivity type. The second region has a second conductivity type and is formed between the cathode region and the first region. The cathode region extends from a first surface of the silicon carbide body into the second region. The source electrode and the source region are electrically connected. The source electrode and the second region are in contact with each other. The source electrode and the second region form an ohmic contact. A rectifying junction is electrically coupled between the source electrode and the cathode region.

In an embodiment, a semiconductor device includes an insulated gate transistor cell, a first region, a cathode region, a second region, a source electrode, and a first structure. The first region includes a drain region and/or a drift region. The second region includes an anode region and/or a separation region. The first structure comprises a pad structure and/or a wiring structure. The insulated gate transistor cell includes a source region and a gate electrode. The source region is formed in a silicon carbide body. The cathode region is formed in the silicon carbide body. The gate electrode and the cathode region are electrically connected. The cathode region, the source region, and the first region have a first conductivity type. The second region has a second conductivity type and is formed between the cathode region and the first region. The first structure and the gate electrode are electrically connected. The first structure and the cathode region are electrically connected. The source electrode and the source region are electrically connected. The source electrode and the second region are in contact with each other. The source electrode and the second region form an ohmic contact. A rectifying junction is electrically coupled between the source electrode and the cathode region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and together with the description serve to explain principles of the embodiments. Further embodiments are described in the following detailed description and the claims.

DETAILED DESCRIPTION

Figure 1:
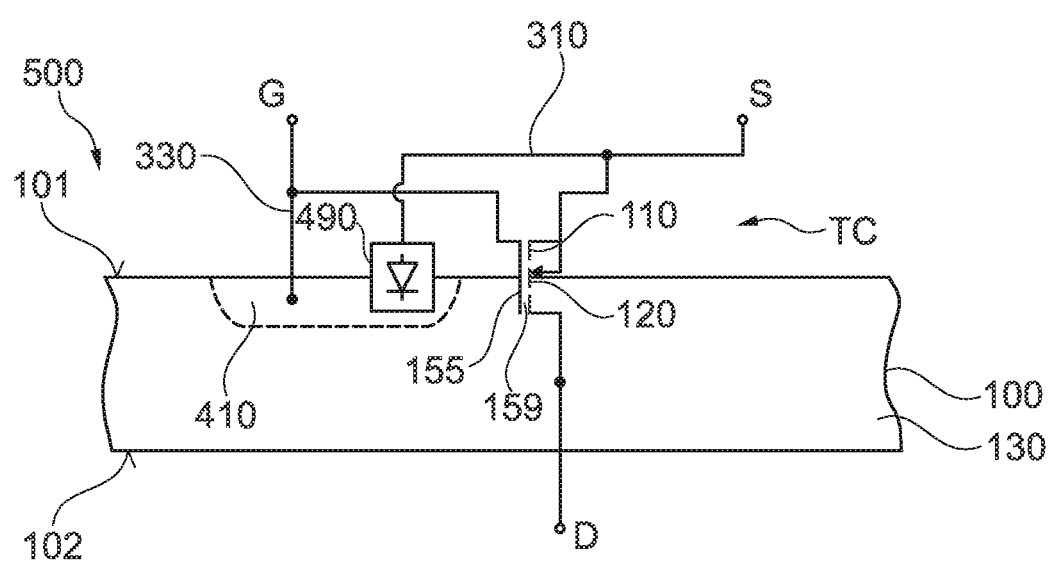
FIG. 1 shows a simplified vertical cross-sectional view of a portion of a semiconductor device with an insulated gate transistor cell and a rectifying junction according to an embodiment.

In the following detailed description, reference is made to the accompanying drawings, which form a part hereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material. The term "electrically coupled" includes that one or more intervening elements adapted for signal and/or power transmission may be connected between the electrically coupled elements, for example, elements that are controllable to temporarily provide a low-resistive connection in a first state and a high-resistive electric decoupling in a second state. An "ohmic contact" is a non-rectifying electrical junction with a linear or almost linear current-voltage characteristic.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

The term "on" is not to be construed as meaning "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

The term "power semiconductor device" refers to semiconductor devices with a high voltage blocking capability of at least 30 V, for example 100 volts (V), 600 V, 1.6 kilovolts (kV), 3.3 kV or more and with a nominal on-state current or forward current of at least 1 ampere (A), for example 10 A or more.

A semiconductor device may include an insulated gate transistor cell. The insulated gate transistor cell may include a source region and a gate electrode. The source region may be formed in a silicon carbide body.

The silicon carbide body may have two essentially parallel main surfaces, which may have approximately the same shape and size, and a lateral surface area connecting the edges of the two main surfaces. For example, the silicon carbide body may be a cylinder or a polygonal, e.g. rectangular or hexagonal, prism with or without rounded edges. The silicon carbide body may have a surface extension along two horizontal directions and may have a thickness along a vertical direction perpendicular to the horizontal directions. The horizontal directions are also referred to as lateral directions in the following.

The material of the silicon carbide body may be single-crystalline silicon carbide, for example 15R—SiC (silicon carbide of 15R-polytype), or silicon carbide with hexagonal polytype like 2H—SiC, 4H—SiC or 6H—SiC, by way of example. In addition to the main constituents silicon and carbon, the silicon carbide body may include dopant atoms, for example nitrogen (N), phosphorous (P), beryllium (Be), boron (B), aluminum (Al) and/or gallium (Ga). The silicon carbide body may also include further impurities, for example hydrogen, fluorine and/or oxygen.

In addition to the source region, the insulated gate transistor cell may further include a body region. The silicon carbide body may further include a drain/drift region (e.g., a region including a drain region and/or a drift region). A portion of the drain/drift region may be effective as the drain of the insulated gate transistor cell.

The source region and the drain/drift region have a first conductivity type. The body region may have a complementary second conductivity type. The body region may spatially separate the source region and the drain/drift region. A gate dielectric may be formed between the gate electrode and the body region. An electric potential applied to the gate electrode controls the distribution of mobile charge carriers in the body region by field effect.

The insulated gate transistor cell may have a positive gate threshold voltage or a negative gate threshold voltage. When a gate-to-source voltage VGS between the gate electrode and the source region exceeds the positive gate threshold voltage or falls below the negative gate threshold voltage, the minority charge carriers form an inversion layer (channel) in the body region along the gate dielectric. The inversion channel connects source region and drain/drift region and the insulated gate transistor turns on. When the gate-to-source voltage VGS falls below the positive gate threshold voltage or increases to above the negative gate threshold voltage, the insulated gate transistor turns off. A positive gate threshold voltage at which a current starts flowing through the channel may be between 2.5V and 6V.

The semiconductor device may further include a source electrode. The source electrode may include and/or may consist of one or more materials with high electrical conductivity (e.g., an electrical conductivity higher than a threshold electrical conductivity). For example, the source electrode may include at least one metal, metal compound and/or metal alloy.

The source electrode may be formed on a first main surface of the silicon carbide body at the front side of the silicon carbide body. The source electrode may be formed directly on the first main surface or may be formed directly on an interlayer dielectric that spatially separates the source electrode and the silicon carbide body. The semiconductor device may further include a drain electrode formed on a second main surface at the back side of the silicon carbide body.

The source electrode and the source region may be electrically connected. For example, the source electrode and the source region may form a low-resistive ohmic contact (e.g., an ohmic contact having a resistivity lower than a threshold resistivity). For example, a source contact structure may extend through an opening in the interlayer dielectric to or into the silicon carbide body, wherein the source contact structure and the source region form an ohmic contact.

In addition, the source electrode and the body region may be electrically connected. For example, the source electrode and the body region may form a low-resistive ohmic contact (e.g., an ohmic contact having a resistivity lower than a threshold resistivity). For example, the source contact structure and the body region may form an ohmic contact. The body region and the drain/drift region form a pn junction, which may be effective as a body diode.

The semiconductor device may further include a cathode region. The cathode region may be formed in the silicon carbide body and may have the same conductivity type as the source region. The gate electrode and the cathode region may be electrically connected.

The gate electrode and the cathode region may be in direct contact or may be electrically connected through a low-impedance structure (e.g., a structure having an impedance lower than a threshold impedance). The low-impedance structure may have ohmic behavior. The resistivity of the low-impedance structure may be at most 10Ω, e.g. at most 5Ω, or at most 2Ω.

An anode/separation region (e.g., a region including an anode region and/or a separation region) of the second conductivity type may be formed in the silicon carbide body between the cathode region and the drain/drift region. The anode/separation region may separate or may contribute to separating the cathode region and the drain/drift region. The anode/separation region and the source electrode may be in direct contact with each other. For example, the source electrode and the anode/separation region may form a metal/semiconductor junction, e.g., a low-resistive ohmic contact (e.g., an ohmic contact having a resistivity lower than a threshold resistivity) or a Schottky contact.

A rectifying junction may be electrically coupled between the source electrode and the cathode region. For example, the rectifying junction may be electrically arranged in series between the cathode region and the source electrode.

The rectifying junction is under reverse bias (reverse biased) when a gate-to-source voltage VGS applied between gate electrode and source electrode has the polarity (sign) of the gate threshold voltage, e.g., when the gate-to-source voltage VGS turns on the insulated gate transistor cell. The rectifying junction is under forward bias (forward biased), when a gate-to-source voltage VGS applied between gate electrode and source electrode has the opposite polarity (sign) of the gate threshold voltage.

The drain/drift region may include a heavily doped contact portion. The contact portion and a drain electrode may form a low-resistive ohmic contact (e.g., an ohmic contact having a resistivity lower than a threshold resistivity) along the second main surface. A load current between source electrode and drain electrode substantially flows in a vertical direction from the first main surface to the second main surface or from the second main surface to the first main surface through the silicon carbide body.

In the following, effects of the embodiments are described with reference to an insulated gate transistor cell with a positive gate threshold voltage.

For an insulated gate transistor cell with positive gate threshold voltage, the rectifying junction is under reverse bias when a positive gate-to-source voltage VGS is applied between the gate electrode and the source electrode. Under reverse bias, the rectifying junction blocks up to a peak inverse voltage at which reverse breakdown occurs. The peak inverse voltage may be at least 1.5 times or at least two times the highest recommended gate voltage. For example, the rectifying junction peak inverse voltage may be at least 36V.

The rectifying junction is under forward bias when a negative gate-to-source voltage VGS occurs between gate electrode and source electrode. Under a forward bias greater than a set-in voltage of the rectifying junction, the rectifying junction conducts.

The absolute value of the set-in voltage may be less than twice the absolute value of the minimum gate threshold voltage. For example, the set-in voltage is that of a silicon carbide pn diode (about 3V) or that of a silicon carbide Schottky diode (about 1.5V). The set-in voltage of the rectifying junction defines the clamp voltage for negative overshoots between gate electrode and source electrode.

The rectifying junction may be and/or may include a pn junction formed within the single-crystalline silicon carbide body between the cathode region and the complementary doped anode/separation region. Alternatively or in addition, the rectifying junction may be and/or may include a Schottky contact formed between the cathode region and the source electrode.

The rectifying junction may be effective as clamping diode against negative VGS undershoots directly on chip level. Negative VGS undershoots may be the result of device-internal displacement currents in the silicon carbide body. For example, in an off-state of the insulated gate transistor cell a negative dVDS/dt (e.g., dVDS/dt may correspond to a rate at which drain-to-source voltage changes over time) at the drain terminal may result in an instantaneous current flow through the body diode from the source to the drain (body diode forward recovery). The current flow discharges the device-internal Miller capacitance and may result in a short negative voltage spike across the gate-to-source capacitance.

When the negative voltage across the gate-to-source capacitance falls below the negative set-in voltage of the rectifying junction, the rectifying junction becomes conductive and cuts off more negative voltage spikes. For a turn-off gate drive voltage of 0V, the rectifying junction limits therefore the negative voltage across the gate dielectric to a value given by the set-in voltage of the rectifying junction.

Limiting the peak value of a negative voltage across the gate dielectric may contribute to reducing gate dielectric degradation. Reducing gate dielectric degradation may result in a more stable gate threshold voltage over lifetime. For example, the rectifying junction may contribute to reducing threshold voltage drift and to avoiding an increase of conduction losses over time.

According to an embodiment the source electrode and the anode/separation region may form an ohmic contact. For example, the source electrode may include a layer portion and an anode contact structure. The anode contact structure may extend from the layer portion to or into the anode/separation region, wherein the anode contact structure and the anode/separation region form an ohmic contact.

The connection between source electrode and anode/separation region may be effectively formed by sharing the process for forming ohmic contacts or metal source contact structures between the source electrode and the source regions.

According to an embodiment the cathode region may extend from the first main surface into the anode/separation region. The anode/separation region may form a well that extends from the first main surface into the silicon carbide body. The cathode region may be formed as a well extending from the first main surface into the anode/separation region. A distance between the first main surface and a bottom of the anode/separation region may be greater than a distance between the first surface and a bottom of the cathode region. The anode/separation region may completely surround the cathode region in the silicon carbide body. The anode/separation region may laterally surround the cathode region on all sides and may efficiently separate the cathode region from other further doped regions in the silicon carbide body.

According to an embodiment, the semiconductor device may include a pad/wiring structure (e.g., a structure comprising a pad structure and/or a wiring structure) formed at a front side of the silicon carbide body. The pad/wiring structure or a portion of the pad/wiring structure may form the low-impedance structure between the cathode region and the gate electrode. The pad/wiring structure may include partial structures from heavily doped polycrystalline silicon and/or metal-containing partial structures. The metal-containing partial structures may include and/or consist of elementary metal(s), metal compound(s) and/or metal alloy(s).

The pad/wiring structure and the gate electrode may be electrically connected. For example, the pad/wiring structure and the gate electrode may be in direct contact. The pad/wiring structure and the cathode region may be electrically connected. For example, the pad/wiring structure and the cathode region may form a low-resistive ohmic metal/semiconductor contact (e.g., an ohmic metal/semiconductor contact having a resistivity lower than a threshold resistivity).

Using the pad/wiring structure for connecting the gate electrode with the cathode region may simplify a highly effective integration of a voltage clamping function between gate electrode and source electrode.

The pad/wiring structure may include a gate pad. The pad/wiring structure may further include a gate wiring electrically connecting the gate pad with the gate electrode.

The gate pad may be a rectangular metal structure formed at the front side of the silicon carbide body. For example, the gate pad may be an approximately square metal structure with sufficient thickness and with sufficient lateral size to be suitable as bond base for wire bonding. The gate pad may have a thickness of at least 2 micrometers (μm), for example at least 5 μm or at least 10 μm. The gate pad may have a horizontal surface area of at least 0.1 millimeters squared (mm$^2$). The gate pad and the source electrode may be formed side-by-side on the first main surface and may have the same structural configuration. For example, the gate pad and the source electrode may include the same material and may have the same thickness or may include the same layer stack, wherein corresponding sub-layers of the layer stack are formed from the same material and have the same vertical extension.

The gate wiring may be a further planar metal structure at the front side of the silicon carbide body. The gate wiring may include and/or consist of metal-containing material(s), e.g., elementary metal(s), metal compound(s) and/or metal alloy(s). The gate wiring may be thinner (e.g., significantly thinner) than the gate pad. For example, a thickness of the gate wiring is at most 5 μm. The gate wiring may include interconnected stripe-shaped portions with a typical width of 10 μm.

The gate wiring may include horizontal gate layer portions. The gate layer portions may be formed on the interlayer dielectric or on a sublayer of the interlayer dielectric. The gate wiring may include metal gate contact structures extending from the gate layer portions to or into the gate electrode. The gate wiring may include metal cathode contact structures extending from the gate layer portions to or into the cathode region.

The gate wiring may include gate runners in the lateral periphery of the silicon carbide body. The gate runners may have a longitudinal extension parallel to the closest lateral edge of the silicon carbide body. The gate runners may be formed between the source electrode and edges of the silicon carbide body.

Alternatively and/or in addition to gate runners, the gate wiring may include one or more gate fingers extending from the periphery and/or from the gate pad into a more central portion of the first main surface. The gate fingers may be formed below the source electrode or in gaps between interconnected source electrode sections.

The pad/wiring structure may further include an integrated gate resistor electrically connected (and/or electrically coupled and/or electrically arranged) in series between the gate pad and the gate wiring or in series between a first gate wiring portion and a second gate wiring portion. The integrated gate resistor may include doped semiconductor material, e.g., doped polycrystalline silicon. The electrical resistance of the integrated gate resistor may be in a range from 1Ω to 20Ω, e.g. at least 1Ω, e.g., at least 2Ω, and at most 20Ω, e.g., at most 10Ω. According to an embodiment the gate wiring may be in direct contact with the gate pad.

The gate wiring may be in direct contact with the gate electrode and the cathode region. In case the integrated gate resistor is connected in series between a first gate wiring portion, which is in contact with the gate pad, and a second gate wiring portion, the second gate wiring portion may be in direct contact with the cathode region and the gate electrode.

Placing the integrated gate resistor Rg outside the connection between cathode region and gate electrode may contribute to a faster response time of the clamping diode between gate electrode and source electrode.

According to an embodiment a supplementary diode structure may be formed between the pad/wiring structure and the cathode region and/or between the source electrode and the anode/separation region. The supplementary diode structure may include and/or may consist of polycrystalline semiconductor material. The supplementary diode structure may contribute to tuning the clamp voltage for negative overshoots.

According to an embodiment the cathode region and the source region may have a same vertical net dopant concentration profile. The cathode region and the source region may be contemporaneously formed by sharing at least some process acts. For example, the source region and the cathode process may be defined in the same lithography process and/or may result from the same dopant implantation processes such that the internal clamping diode may be formed in an efficient way without additional costs or at low additional costs.

According to an embodiment the anode/separation region and the cathode region form a pn junction in the silicon carbide body and the pn junction formed between the cathode region and the anode/separation region may form at least part of the rectifying junction between the source electrode and the cathode region.

The anode/separation region may be a structure formed exclusively for the rectifying junction. Alternatively, the anode/separation region serves also another purpose.

For example, the anode/separation region may be a portion of a doped region of the insulated gate transistor cell or may result from a moderate modification, e.g. a lateral extension, of a doped region provided for the insulated gate transistor cell such that the internal clamping diode can be formed in an effective way and without loss of active area or with only low loss of active area.

According to another example, the anode/separation region may be part of a p conducting well, wherein other portions of the p conducting well form the body regions of insulated gate transistor cells. The anode/separation region may be part of a p conducting deep implantation region, wherein other portions of the deep implantation region form shielding regions for trench gate structures and/or for deep contact structures.

According to an embodiment the anode/separation region may include an anode contact portion and a junction portion. The anode contact portion and the source electrode may form an ohmic contact. The junction portion and the cathode region may form a pn junction. The anode contact portion may have a higher net dopant concentration than the junction portion. For example, a maximum net dopant concentration in the anode contact portion is at least ten times as high as a mean net dopant concentration in the junction portion.

The dopant concentrations effective for the ohmic contact and effective for the rectifying junction may be selected independently from each other and may be selected to achieve both a low-resistive ohmic contact (e.g., an ohmic contact having a resistivity lower than a threshold resistivity) with the source electrode and a sufficient reverse blocking capability (peak inverse voltage) for the rectifying junction.

According to an embodiment the semiconductor device may further include a blocking region with a conductivity type opposite to the conductivity type of the cathode region. The blocking region may be formed between the drain/drift region and the cathode region. For example, the blocking region may be formed between the anode/separation region and the second main surface.

A mean net dopant concentration in the blocking region may be higher than a mean net dopant concentration in the anode/separation region. The dopant concentration in the blocking region and the vertical extension of the blocking region may be selected to reliably suppress a latch-up of the parasitic npn structure formed by the n conducting cathode region, the p conducting anode/separation region and the n conducting drain/drift region. For example, a mean net dopant concentration in the blocking region is at least ten times as high as a mean net dopant concentration in the anode/separation region The blocking region may be in contact with the anode/separation region and may vertically separate the anode/separation region and the drain/drift region. The blocking region may be a horizontal layer. A lateral extension of the blocking region may be greater than a lateral extension of the cathode region. A vertical projection of the cathode region onto a horizontal surface of the blocking region may fall completely within the lateral circumference of the blocking region.

According to an embodiment, the source electrode and the cathode region may form a Schottky contact. The Schottky contact may form the rectifying junction or a part of the rectifying junction.

Since the forward current through a Schottky contact is a unipolar current, the clamping function is extremely fast and may prevent undershoot even at high switching frequencies (e.g., switching frequencies higher than a threshold switching frequency) or when parasitic inter chip oscillations occur in power modules with a plurality of parallel semiconductor switches.

The set-in voltage may be selected through the metal forming the Schottky contact. For example, the source electrode or the metal source contact structure may include a Schottky metal selected from an elementary metal, from a metal alloy, from a metal carbide or from a metal nitride. A suitable elementary metal may be molybdenum (Mo), aluminum (Al), titanium (Ti), tungsten (W) or nickel (Ni). A suitable metal nitride may be molybdenum nitride (MoN) or titanium nitride (TiN). A suitable metal carbide may be titanium carbide (TiC) or tungsten carbide (WC).

By selecting an appropriate metal, the set-in voltage of the rectifying junction may be adjusted to a value in a range from 0.5V to 2V.

According to an embodiment, the cathode region may include a cathode contact portion and a Schottky portion. The cathode contact portion may have a higher net dopant concentration than the Schottky portion. The cathode contact portion and the pad/wiring structure form an ohmic contact. The Schottky portion and the source electrode form the Schottky contact.

The dopant concentrations effective for the ohmic contact and effective for the Schottky contact may be selected independently from each other and may be adapted to achieve both a low-resistive ohmic contact (e.g., an ohmic contact having a resistivity lower than a threshold resistivity) between the cathode region and the gate electrode and a suitable Schottky contact between the cathode region and the source electrode.

FIG. 1 shows a portion of a semiconductor device 500 with a silicon carbide body 100. The semiconductor device 500 may be and/or may include an IGFET (insulated gate field effect transistor), for example an MOSFET (metal oxide semiconductor field effect transistor).

The silicon carbide body 100 may include and/or consist of single crystalline silicon carbide, e.g., a silicon carbide crystal including the main constituents silicon and carbon. The silicon carbide crystal may include dopant atoms and further impurities like hydrogen, fluorine and/or oxygen. The polytype of the silicon carbide crystal may be 15R or may be hexagonal, e.g. 2H, 6H, or 4H. The silicon carbide body 100 may include and/or consist of a silicon carbide layer grown by epitaxy.

A first main surface 101 at a front side of the silicon carbide body 100 may be planar or ribbed. A mean plane of the first main surface 101 extends along horizontal directions. The mean plane of a planar first main surface 101 is identical to the planar first main surface 101. In case of a non-planar first main surface 101, for example in case of a ribbed first main surface 101, the mean plane may be a planar least squares plane. Position and orientation of the planar least squares plane are defined such that the sum of the squares of the deviations of surface points of the ribbed first main surface 101 from the planar least squares plane has a minimum. A vertical direction is orthogonal to the horizontal directions, e.g. parallel to the surface normal onto the mean plane. The horizontal directions are also referred to as lateral directions in the following.

The vertical direction may coincide with a main lattice direction or may be tilted to a main lattice direction by an off-axis angle, wherein the off-axis angle may be in a range from 2° to 8°, such as about 4°. At the back side of the silicon carbide body 100, a second mean surface 102 may extend parallel to a planar first main surface 101 or parallel to the least squares plane of a ribbed first main surface 101.

An insulated gate transistor cell TC is formed at the front side of the silicon carbide body 100. A drain/drift region 130 laterally extends through the silicon carbide body 100 between the insulated gate transistor cells TC and the second main surface 102. The drain/drift region 130 may include a voltage sustaining structure, e.g., a lightly doped drift zone.

The insulated gate transistor cell TC includes a source region 110 and a body region 120. The source region 110, the body region 120 and the drain/drift region 130 are doped regions in the silicon carbide body 100. The source region 110 has a first conductivity type. The body region 120 has a second conductivity type. For example, the source region 110 is n conducting and the body region 120 is p conducting.

The source region 110 and the body region 120 are electrically connected to a source electrode 310. The source electrode 310 may form or may be electrically connected or electrically coupled to a source terminal S. The drain/drift region 130 is electrically connected to a drain terminal D.

A gate dielectric 159 separates a gate electrode 155 and the body region 120. A low impedance path (e.g., a path having an impedance lower than a threshold impedance) may electrically connect the gate electrode 155 and a pad/wiring structure 330 on the first main surface 101. The pad/wiring structure 330 may include or may be electrically connected or coupled to a gate terminal G. The low impedance path may have ohmic behavior and may have a resistivity of at most 10Ω, e.g. at most 5Ω or at most 2Ω.

The silicon carbide body 100 further includes a cathode region 410 of the first conductivity type. The cathode region 410 and the pad/wiring structure form a low-resistive ohmic contact (e.g., an ohmic contact having a resistivity lower than a threshold resistivity). The cathode region 410 may extend from the first main surface 101 into the silicon carbide body 100. A rectifying junction 490 is electrically connected in series between the source electrode 310 and the cathode region 410.

A plurality of insulated gate transistor cells TC may be electrically connected in parallel. The silicon carbide body 100 may include a plurality of spatially separated cathode regions 410. One or more rectifying junctions 490 may be formed between each cathode region 410 and the source electrode 310.

The set-in voltage of the rectifying junction 490 clamps a negative gate voltage VGS between the cathode region 410 and the source electrode 310. The rectifying junction 490 may effectively limit the amplitude of negative voltage glitches between gate electrode 155 and source electrode 310. Negative voltage glitches (undershoots) between gate electrode 155 and source electrode 310 may occur, if during the off-state of the insulated gate transistor cell TC the body diode BD starts to conduct (body diode forward recovery).

Figure 2A:
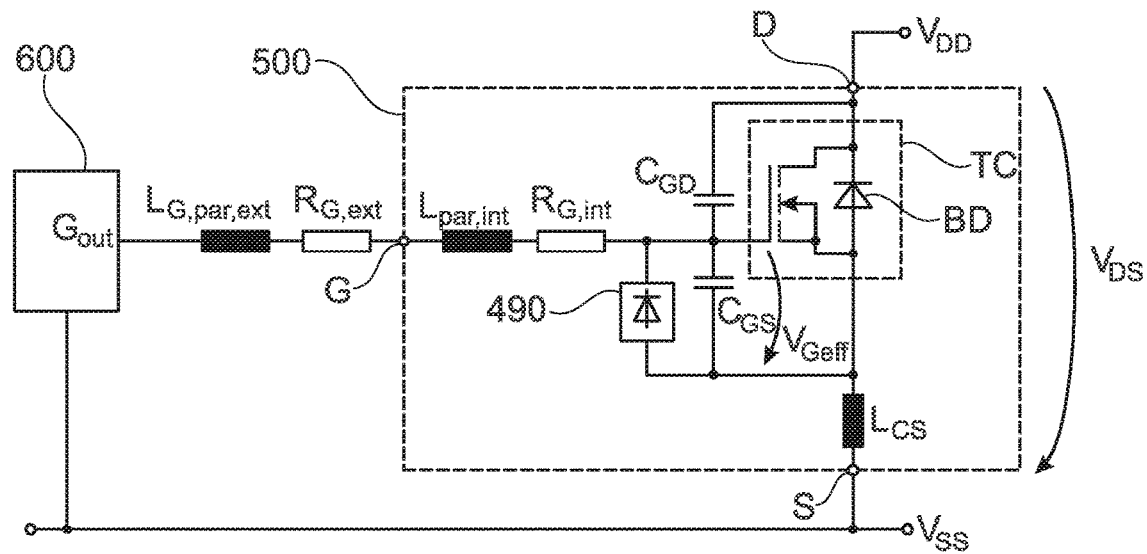
FIG. 2A shows a simplified circuit diagram with a gate driver device and an equivalent circuit diagram of a semiconductor device with an insulated gate transistor cell for discussing effects of the embodiments.

FIG. 2A shows a simplified equivalent circuit diagram of a semiconductor device 500 with insulated gate transistor cell TC and body diode BD in combination with a gate driver circuit 600. A gate-to-drain capacity CGD (Miller capacity) is effective between gate terminal G and drain terminal D. A gate-to-source capacity CGS is effective between gate terminal G and source terminal S. A parasitic common source inductance LCS may be effective both in the gate current loop and the load current loop. A parasitic internal gate inductance Lpar,int may be effective between gate terminal G and the insulated gate transistor cell TC. An internal gate resistance RG,int may be effective between gate terminal G and insulated gate transistor cell TC. An integrated gate resistor, a bond wire between gate terminal and gate pad, and the pad/wiring structure may contribute to the internal gate resistance RG,int and to the parasitic internal gate inductance Lpar,int. A bond wire between source terminal S and source pad may contribute to the common source inductance LCS.

A driver output Gout of the gate driver circuit 600 is connected to the gate terminal G through a connection line that contributes to a parasitic external gate inductance Lpar, ext and to an external gate resistance RG,ext. A discrete resistor element may be electrically connected in series between the driver output Gout and the gate terminal G.

The gate driver 600 may supply a drive gate voltage VGout of 0V that turns off the insulated gate transistor cell TC. When during the off-state of the insulated gate transistor cell TC a negative dVDS/dt occurs, the body diode BD may start to conduct. The body diode BD may become conductive, when an inductive load, which is connected to the drain terminal D, is separated from a positive voltage supply by another switch. For example, the body diode BD may become conductive in resonant power supplies, inverter circuits and half bridges wherein current can flow through the body diode during freewheeling and synchronous rectification operation.

The forward recovery of the body diode BD discharges the Miller capacity CGD. The associated device-internal displacement current also discharges the gate-to-source capacitance CGS, wherein an effective gate-to-source voltage VGeff across the gate dielectric of the insulated gate transistor cell TC may fall significantly below the drive gate voltage VGout. Even when the gate driver 600 uses 0V as turn-off voltage, the gate dielectric of the insulated gate transistor cell TC may be periodically stressed with a negative voltage at high repetition rate (e.g., a repetition rate higher than a threshold repetition rate). The negative voltage may result in gate dielectric degradation over time.

The rectifying junction 490 limits the negative voltage across the gate dielectric to about the set-in voltage of the rectifying junction 490. The operation of the rectifying junction 490 is not adversely affected or only to a low degree adversely affected by the parasitic inductances LCS, Lpar,int and the internal gate resistance RG,int.

Figure 2B:
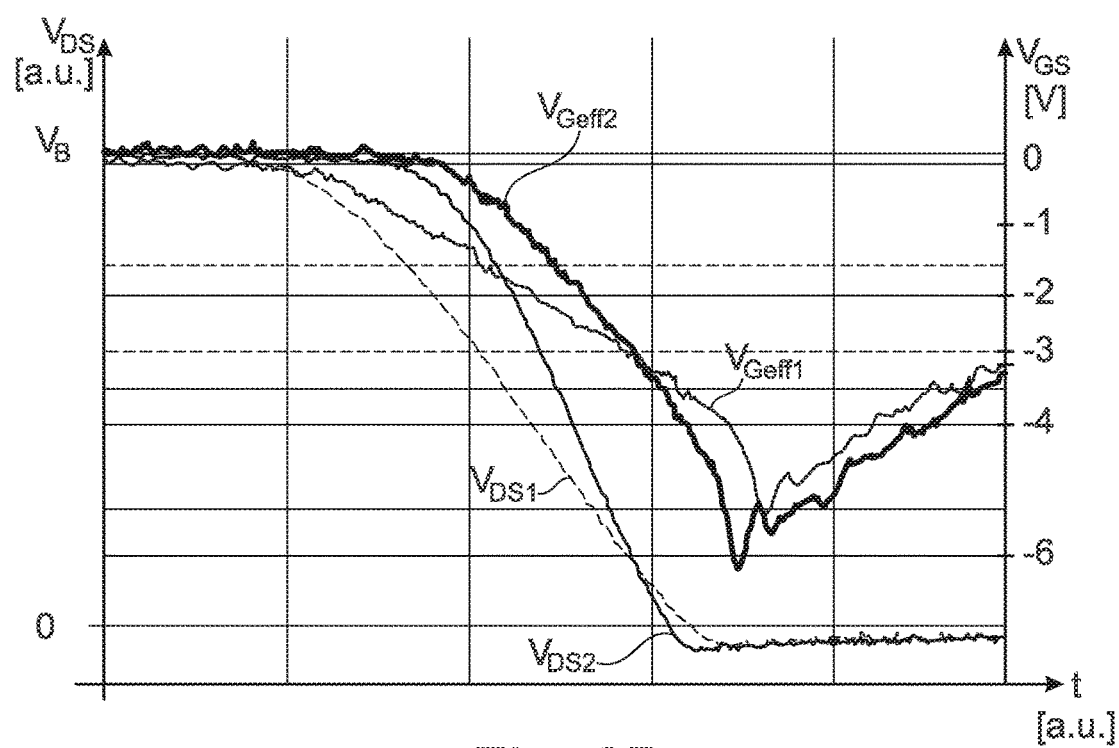
FIG. 2B shows simplified diagrams for VGS and VDS for a semiconductor device for illustrating effects of the embodiments.

FIG. 2B illustrates drain-to-source voltage gradients VDS1, VDS2 and corresponding effective gate-to-source voltage gradients VGeff1, VGeff2 across the gate dielectric in the semiconductor device 500 of FIG. 2A without the rectifying junction 490 of FIG. 2A. VDS1, VGeff1 refer to slow switching. VDS2, VGeff2 refer to fast switching.

The gate driver circuit 600 in FIG. 2A drives an output gate voltage VGout of 0V that turns off the insulated gate transistor cell TC. The semiconductor device 500 may block a high voltage VB (e.g., a voltage higher than a threshold voltage) between drain and source. Switching off a conductive load, which is connected to the drain terminal, may result in that the drain-to-source voltages VDS1 and VDS2 fall to the forward voltage of the body diode. Discharge of the Miller capacity results in VGeff1 undershoots and VGeff2 undershoots to below −5V. The rectifying junction 490 shown in FIG. 2A may cut off voltage glitches for VGeff1 and VGeff2, which are more negative than about −3V in case the rectifying junction 490 is a silicon carbide pn junction or which are more negative than −1.5V in case the rectifying junction 490 is a silicon carbide Schottky contact. The rectifying junction 490 may be active (forward conducting) for more than 50 nanoseconds (ns), e.g. more than 100 ns per switching cycle. The effect of the rectifying junction 490 on threshold voltage stability increases with increasing switching frequency.

Figure 3A:
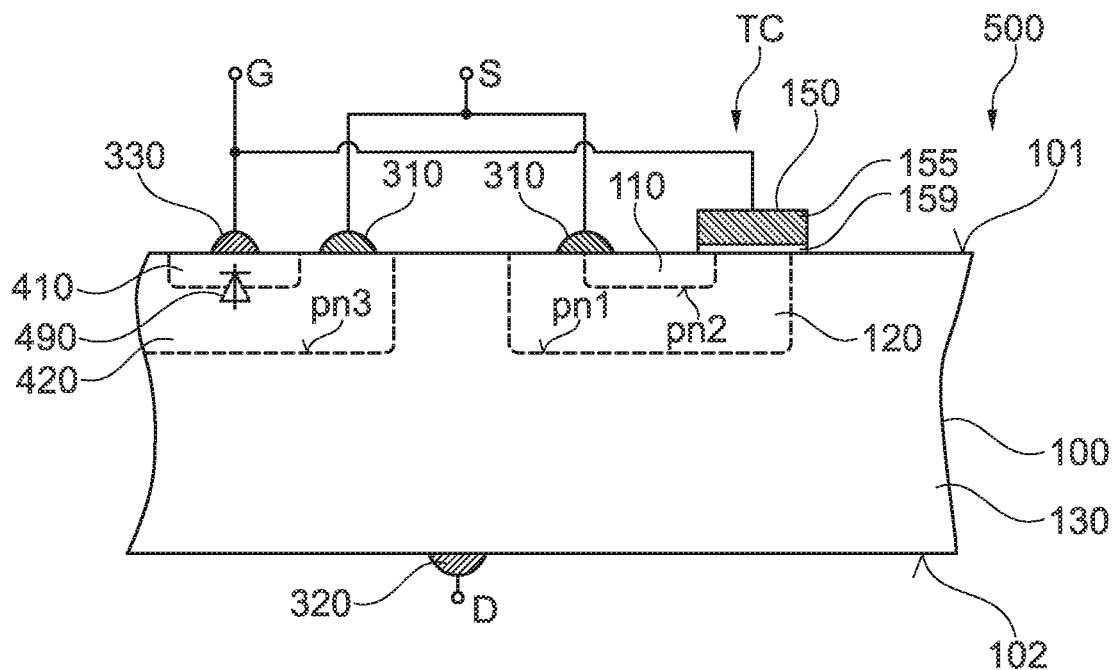
FIGS. 3A-3D show simplified vertical cross-sectional views of portions of semiconductor devices with insulated gate transistor cells and rectifying junctions according to embodiments related to planar gate electrodes and to trench gate electrodes.
Figure 3B:
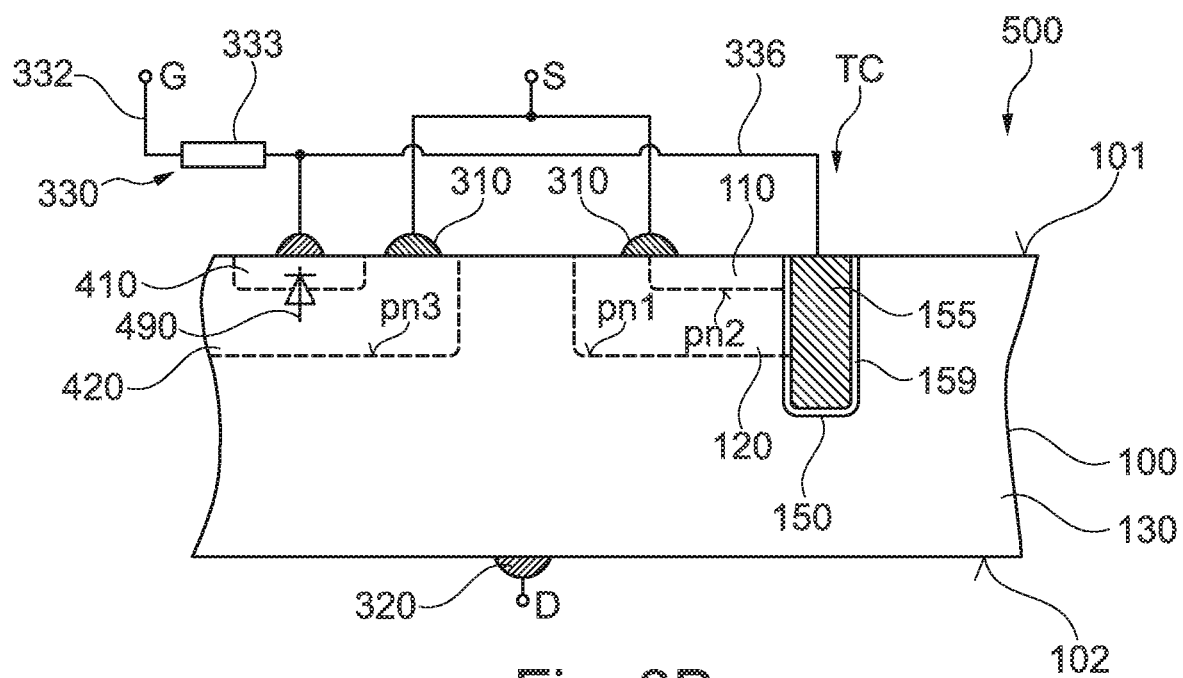

Each of FIGS. 3A and 3B shows a semiconductor device 500, which includes an insulated gate transistor cell TC, a pad/wiring structure 330, a source electrode 310 and a rectifying junction 490 as described with reference to FIG. 1, wherein the rectifying junction 490 is a pn junction between the cathode region 410 and an anode/separation region 420. The rectifying junction 490 may have a set-in voltage of less than 3.5V.

The body region 120 may extend from the first main surface 101 into the silicon carbide body 100. The source region 110 may extend from the first main surface 101 into the body region 120. The body region 120 and the drain/drift region 130 form a first pn junction pn1. The body region 120 and the source region 110 form a second pn junction pn2.

The gate electrode 155 may include heavily doped polycrystalline silicon. The gate dielectric 159 may consist of or may include silicon oxide, silicon nitride and/or siliconoxynitride. The gate dielectric 159 separates the body region 120 and the gate electrode 155.

The anode/separation region 420 may extend from the first main surface 101 into the silicon carbide body 100. The anode/separation region 420 and the drain/drift region 130 form a third pn junction pn3. The cathode region 410 may extend from the first main surface 101 into the anode/separation region 420.

The cathode region 410 and the anode/separation region 420 form the rectifying junction 490.

The anode/separation region 420 and the body region 120 may be laterally separated as illustrated. According to another example, the anode/separation region 420 and the body region 120 may be in direct, lateral contact. In other words, the anode/separation region 420 and the body region 120 may be parts of a contiguous doped region including the body region 120 and the anode/separation region 420.

Anode/separation region 420 and body region 120 may have the same vertical extension and/or may have the same or approximately the same vertical dopant profile. Cathode region 410 and source region 110 may have the same vertical extension and/or may have the same or approximately the same vertical dopant profile.

The pad/wiring structure 330 is formed on the first main surface 101. The pad/wiring structure 330 and the cathode region 410 form an ohmic metal/semiconductor junction. The pad/wiring structure 330 may form or may be electrically connected or electrically coupled to a gate terminal G.

The source electrode 310 is formed on the first main surface 101. The source electrode 310 and the anode/separation region 420 form an ohmic metal/semiconductor junction. The source electrode 310 may form or may be electrically connected to a source terminal S. The drain electrode 320 may be electrically connected or electrically coupled to the drain/drift region 130. The drain electrode 320 may form or may be electrically connected to a drain terminal D.

The source electrode 310 and the source region 110 may form an ohmic metal/semiconductor junction. The source electrode 310 and the body region 120 may form an ohmic metal/semiconductor junction.

In FIG. 3A the gate structure 150 including the gate electrode 155 and the gate dielectric 159 forms a planar gate on the first main surface 101.

In FIG. 3B the gate structure 150 forms a trench gate extending form the first main surface 101 into the silicon carbide body 100. The pad/wiring structure 330 includes an integrated gate resistor 333 electrically connected and/or electrically coupled (and/or electrically arranged) between a gate pad 332 and a gate wiring 336. The gate pad 332 may form the gate terminal G. Alternatively, a bond wire may electrically connect the gate pad 332 and the gate terminal G. The gate wiring 336 may be in direct contact with the cathode region 410 and with the gate electrode 155.

Figure 3C:
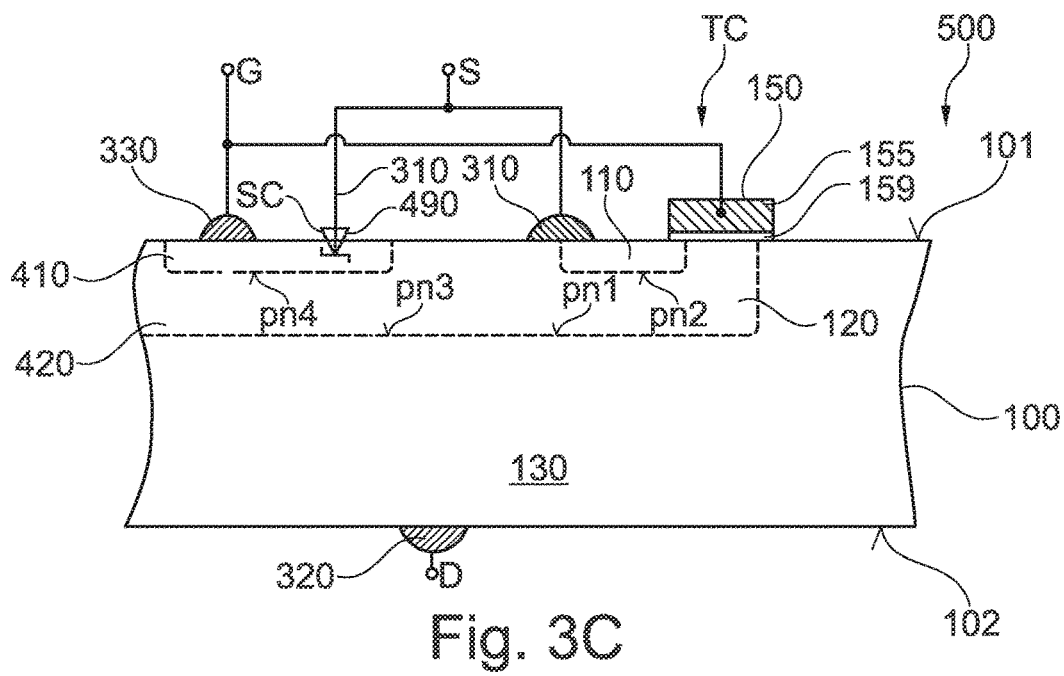
Figure 3D:
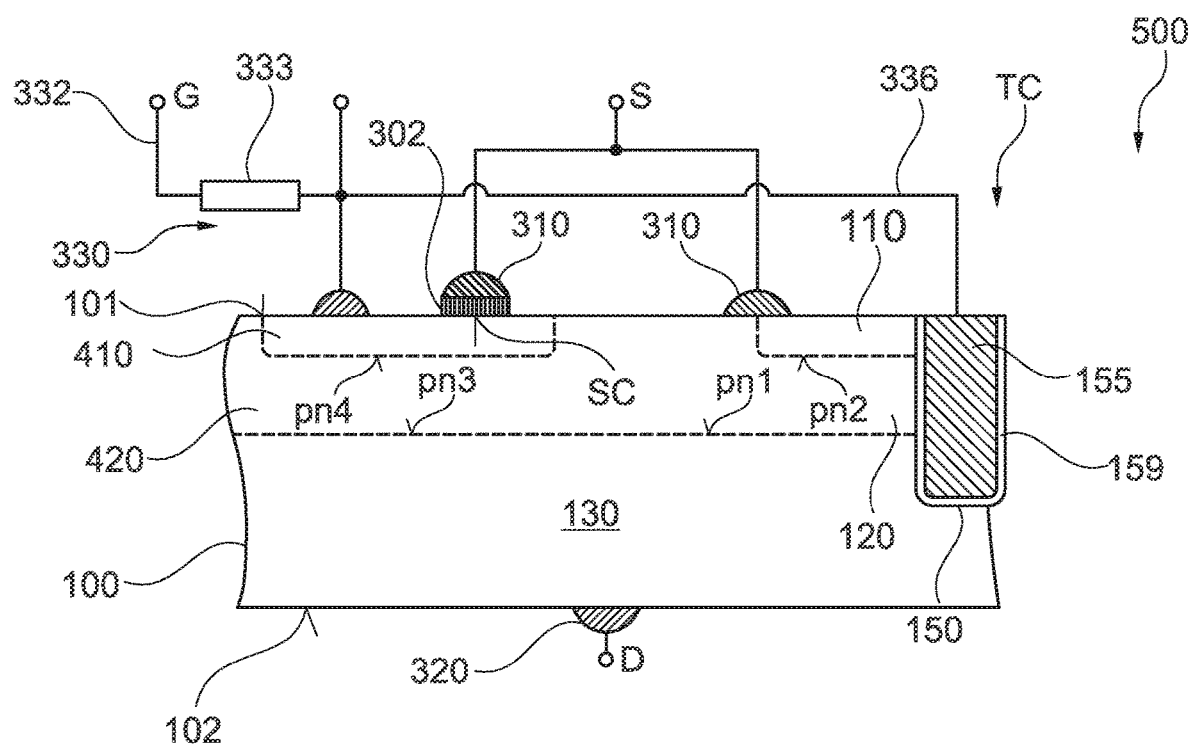

Each of FIGS. 3C and 3D shows a semiconductor device 500 with a Schottky contact SC forming at least a portion of the rectifying junction 490 between the source electrode 310 and the cathode region 410. The anode/separation region 420 separates the cathode region 410 from further doped regions in the silicon carbide body 100, e.g., from the drain/drift region 130. The anode/separation region 420 and the cathode region 410 form a fourth pn junction pn4.

According to FIG. 3D the source electrode 310 may include a Schottky anode layer 302 in direct contact with the cathode region 410. The Schottky anode layer 302 may be formed exclusively in regions where the source electrode 310 is in contact with the cathode region 410. The Schottky anode layer 302 may be absent in regions, where the source electrode 310 is in contact with a body region 120 or with a source region 110.

FIGS. 3C and 3D further show the anode/separation region 420 and the body region 120 as different sections of a contiguous doped region.

Figure 4:
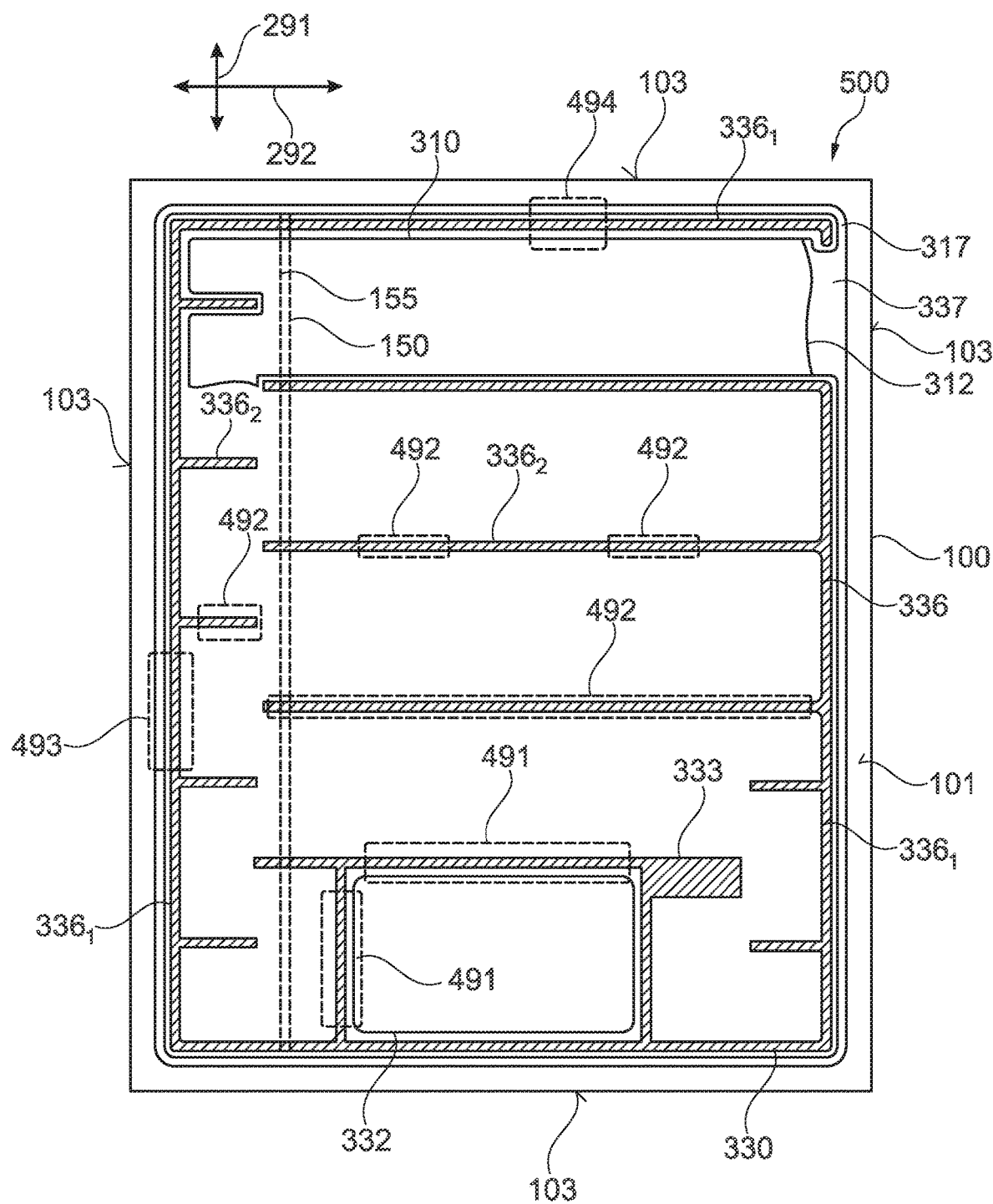
FIG. 4 shows a simplified plan view of a semiconductor device and indicates possible areas for a rectifying junction according to embodiments.

FIG. 4 shows a plan view of the front side of a silicon carbide body 100, wherein one illustrated stripe-shaped gate structure 150 is representative of a plurality of trench gate structures extending parallel to a horizontal first direction 291. A first main surface 101 at the front side of the silicon carbide body 100 and a lateral outer surface 103 of the silicon carbide body 100 may form a front side chip edge with four straight portions oriented orthogonal to each other.

A pad/wiring structure 330 includes a gate pad 332, an integrated gate resistor 333 and a gate wiring 336. The gate pad 332 may be formed close to the chip edge, e.g., along a central part of a straight portion of the chip edge. The gate pad 332 may include a thin layer portion and a thick metallization formed on the thin layer portion. The thin layer portion may include elementary titanium, a titanium compound, e.g. titanium nitride (TiN), elementary tantalum (Ta), and/or a tantalum compound, e.g. tantalum nitride (TaN). The thick metallization may include elementary copper (Cu), a copper alloy, elementary aluminum (Al), an aluminum alloy and/or a copper aluminum alloy.

The integrated gate resistor 333 may include doped polycrystalline silicon. A first side of the integrated gate resistor 333 may be electrically connected to the gate pad 332. A second, opposite side of the integrated gate resistor 333 may be directly connected with the gate wiring 336. The gate wiring 336 includes and/or consists of a thin layer portion. The thin layer portion of the gate wiring 336 and the thin layer portion of the gate pad 332 may have the same structural configuration.

For example, both thin layer portions may include the same material and may have the same thickness or may be formed from the same layer stack.

The gate wiring 336 may include stripe-shaped gate runners $336_1$ and stripe-shaped gate fingers $336_2$. The gate runners $336_1$ may have a longitudinal extension parallel to the closest straight portion of the chip edge. Four gate runners $336_1$ may form a frame along the chip edge, wherein the frame may have a gap 337. Gate fingers $336_2$ extend along a direction intersecting the gate structures 150. For example, the gate fingers $336_2$ may extend along a horizontal second direction 292, which is orthogonal to the first direction 291. Each gate finger $336_2$ may be in contact with at least one gate runner $336_1$. Each gate finger $336_2$ electrically connects the gate electrodes 155 of a plurality of gate structures 150 directly or through gate contact structures extending from planar layer portions of the gate wiring 336 to or into the gate electrodes 155. Each gate electrode 155 may be directly connected to a plurality of gate fingers $336_2$.

A source electrode 310 may include a source pad 312. The source pad 312 may include a thin layer portion and a power metallization formed on the thin layer portion. The thin layer portion may include elementary titanium, a titanium compound, e.g. titanium nitride (TiN), elementary tantalum (Ta), and/or a tantalum compound, e.g. tantalum nitride (TaN). The power metallization may include elementary copper (Cu), a copper alloy, elementary aluminum (Al), an aluminum alloy or a copper aluminum alloy. The power metallization of the source pad 312 and the thick metallization of the gate pad 332 may have the same structural configuration.

The source pad 312 may cover the gate fingers $336_2$ or the source pad 312 may include a plurality of interconnected source pad sections, wherein the gate fingers $336_2$ are formed in gaps between neighboring source pad sections.

The source electrode 310 may further include a source runner 317. The source runner 317 may form a frame interleaved between the gate runners $336_1$ and the chip edge. The source runner 317 includes and/or consists of a thin layer portion. The thin layer portion of the source runner 317 and the thin layer portion of the source pad 312 may have the same structural configuration and may form a contiguous structure extending through the gap 337 in the gate runner frame.

The semiconductor device 500 may include a first rectifying junction 491 formed along an edge of the gate pad 332, a second rectifying junction 492 formed along a gate finger $336_2$, a third rectifying junction 493 formed along a gate runner $336_1$ extending along the first direction 291 and/or a fourth rectifying junction 494 formed along a gate runner $336_1$ extending along the second direction 292.

The first rectifying junction 491 may extend along one, two, three or all edges of the gate pad 332. The first rectifying junction 491 may be one contiguous structure or may include two or more laterally separated sub-portions.

The second rectifying junction 492 may extend along one gate finger $336_2$ or may include two or more sub-portions extending along one, two, three or all gate fingers $336_2$. Along a gate finger $336_2$, one single sub-portion may be formed. The single sub-portion may extend across at least half of the length of the respective gate finger $336_2$ or across at least 90% of the gate finger length. Alternatively, more than one sub-portion may be formed along at least one of the gate fingers $336_2$.

The third rectifying junctions 493 may extend along one of the gate runners $336_1$ parallel to the first direction 291 or may include two or more sub-portions extending along different gate runners $336_1$. Along each gate runner $336_1$, one single sub-portion may be formed. The single sub-portion may extend across at least half of the length of the respective gate runner $336_1$ or across at least 90% of the gate runner length. Alternatively, more than one sub-portion may be formed along a gate runner $336_1$.

The fourth rectifying junction 494 may extend along one of the gate runners $336_1$ parallel to the second direction 292 or may include two or more sub-portions extending along the same or along different ones of the gate runners $336_1$ extending parallel to the second direction 292. The fourth rectifying junction 494 may have a similar structure or the same structure as the second rectifying junction 492. The fourth rectifying junctions 494 may be formed between the gate runner $336_1$ and the source pad 312 and/or between the gate runner $336_1$ and the source runner 317.

A semiconductor device 500 may exclusively include a first rectifying junction 491, a second rectifying junction 492, a third rectifying junction 493 or a fourth rectifying junction 494, may include any combination of two or three of said rectifying junctions 491, 492, 493, 494 or may include all four rectifying junctions.

Each of FIGS. 5A to 5E may refer to any of a first, second, third or fourth rectifying junction 491, 492, 493, 494 as described with reference to FIG. 4. Accordingly, the respective pad/wiring structure 330 may be a gate pad, a gate finger or a gate runner. The respective source structure 310 may be a source pad or a source runner, by way of example.

The silicon carbide body 100 includes an n conducting cathode region 410 and a p conducting anode/separation region 420 that separates the cathode region 410 from an n conducting portion of the drain/drift region 130. The anode/separation region 420 and the cathode region 410 form a rectifying junction 490.

An interlayer dielectric 210 may be formed directly on the first main surface 101. The interlayer dielectric 210 may be a homogenous layer or may include at least two partial layers. For example, the interlayer dielectric 210 may include a base layer with the same structural configuration as a gate dielectric of the insulated gate transistor cells TC.

The pad/wiring structure 330 includes a cathode contact structure 334 that extends from a layer portion of the pad/wiring structure 330 through the interlayer dielectric 210 to the first main surface 101 or into the cathode region 410.

The source electrode 310 includes an anode contact structure 314 that extends from a layer portion of the source electrode 310 through the interlayer dielectric 210 to the first main surface 101 or into the anode/separation region 420.

Figure 5A:
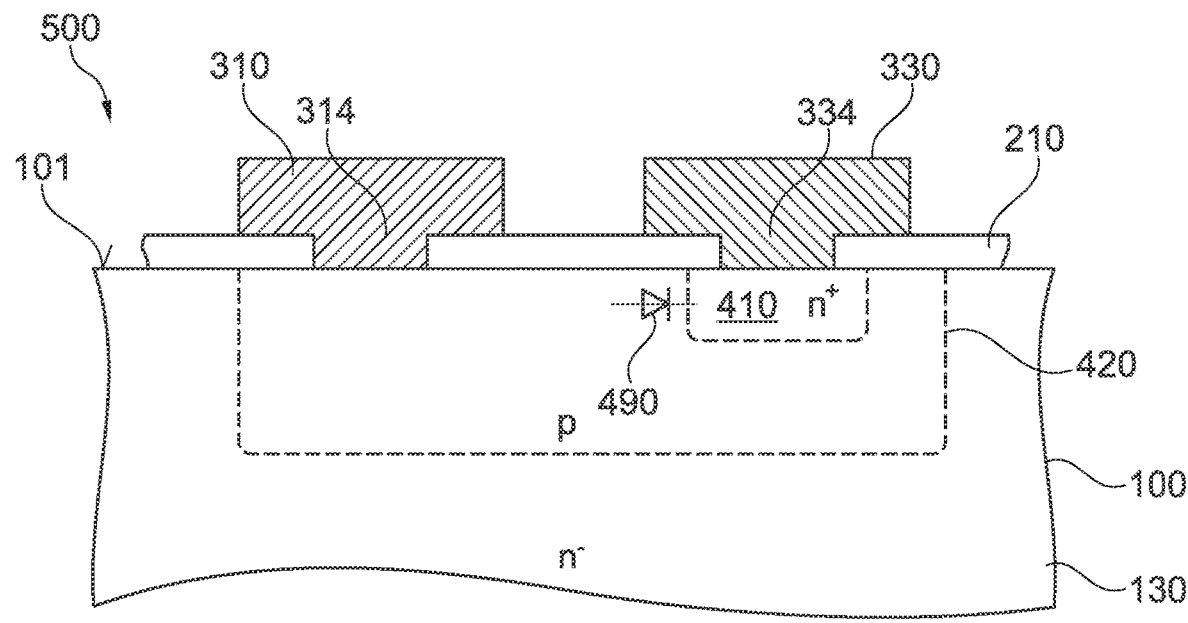
FIGS. 5A-5E show simplified vertical cross-sectional views of portions of a semiconductor device according to embodiments related to cathode regions formed directly below a pad/wiring structure at a front side of the semiconductor device.

In FIG. 5A the anode/separation region 420 is approximately homogeneously doped in the lateral directions.

Figure 5B:
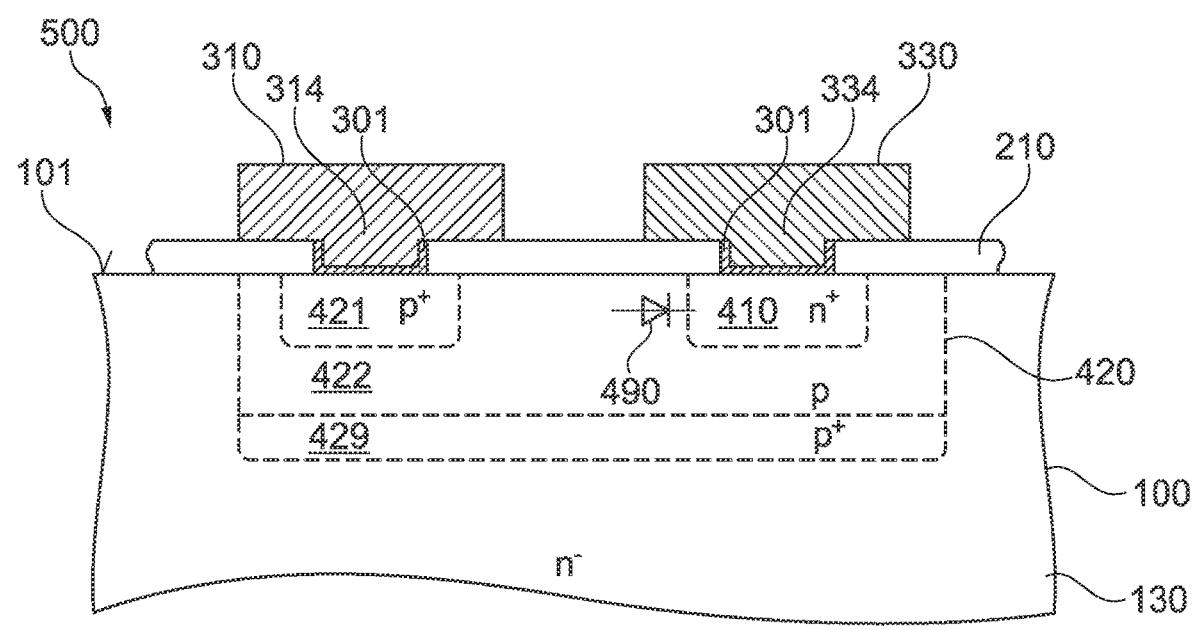

FIG. 5B shows an anode/separation region 420 that includes an anode contact portion 421 and a junction portion 422. The anode contact portion 421 and the source electrode 310 form an ohmic contact. The junction portion 422 and the cathode region 410 form the rectifying junction 490. The anode contact portion 421 has a higher net dopant concentration than the junction portion 422. For example, the maximum net dopant concentration in the anode contact portion 421 is at least ten times as high as a maximum net dopant concentration in the junction portion 422.

A p conducting blocking region 429 is formed between the drain/drift region 130 and the cathode region 410. The blocking region 429 and the anode/separation region 420 may form a contiguous p conducting region. A maximum net dopant concentration in the blocking region 429 is higher than in the junction portion 422. For example, the maximum net dopant concentration in the blocking region 429 is at least ten times as high as a maximum net dopant concentration in the junction portion 422.

The anode contact structure 314 and the cathode contact structure 334 may include a contact layer 301, which is in direct contact with the silicon carbide body 100. The contact layer 301 may line the respective contact opening in the interlayer dielectric 210. The contact layer 301 may include an elementary metal, a metal silicide, metal carbide or a metal nitride. A suitable elementary metal may be titanium (Ti) or tantalum (Ta). A suitable metal nitride may be titanium nitride (TiN).

Figure 5C:
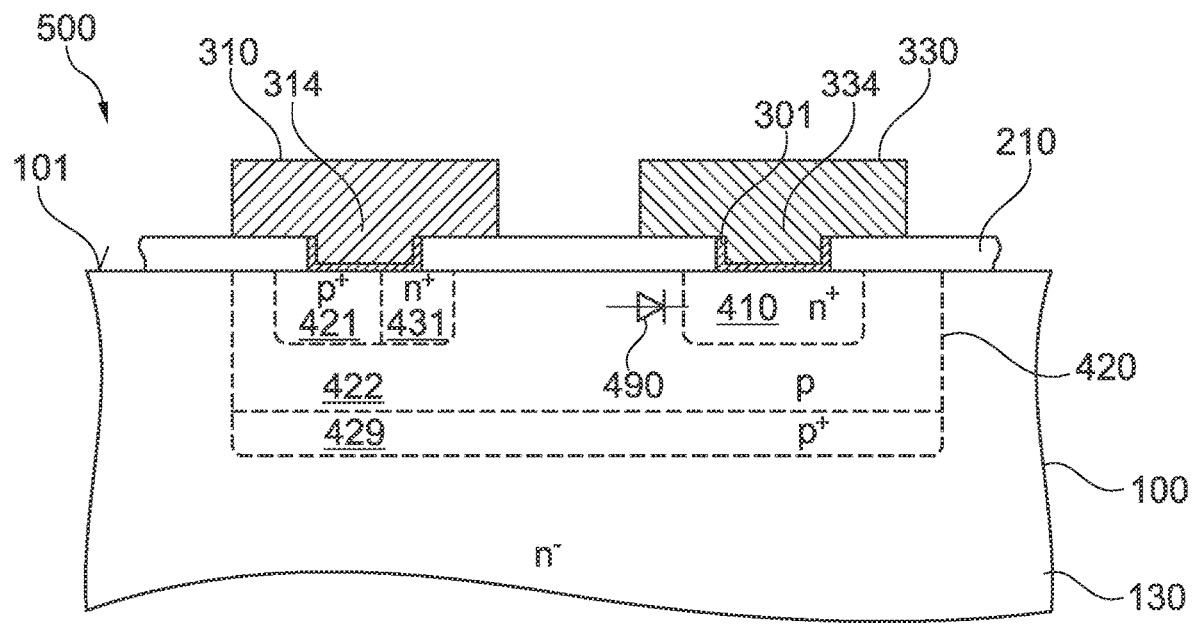

In FIG. 5C an n conducting auxiliary region 431 extends between the anode contact portion 421 and the cathode portion 410 from the first main surface 101 into the anode/separation region 422.

The auxiliary region 431 may laterally directly adjoin the anode contact portion 421 at the side oriented to the cathode region 410. A maximum dopant concentration in the auxiliary region 431 may be within the same order of magnitude as in the cathode region 410. The auxiliary region 431 and the anode contact structure 314 may form an ohmic contact. The auxiliary region 431 may limit the lateral expansion of a depletion zone in the reverse biased mode of the rectifying junction 490.

Figure 5D:
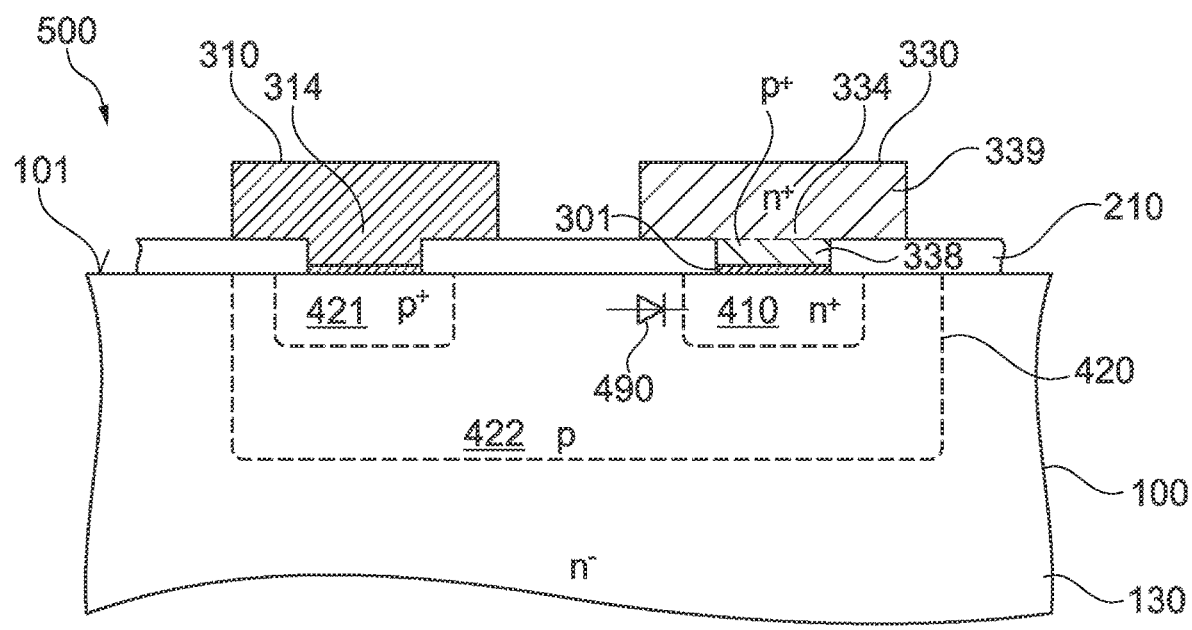

In FIG. 5D the pad/wiring structure 330 includes a p doped polycrystalline portion 338 and an n doped polycrystalline portion 339. The p doped polycrystalline portion 338 and the n doped polycrystalline portion 339 form a supplementary diode structure connected electrically in series with the rectifying junction 490 and between the rectifying junction 490 and the pad/wiring structure 310.

At least the p doped polycrystalline portion 338 may be formed in a contact opening of the interlayer dielectric 210. The n doped polycrystalline portion 339 may also be formed in the contact opening and/or may be formed on the interlayer dielectric 210. The semiconductor device 500 may include a plurality of oppositely doped polycrystalline portions forming pn junctions electrically connected in series with the rectifying junction 490. Alternatively or in addition a supplementary diode structure as described may be formed between source electrode 310 and anode contact portion 421, e.g. at least partly substituting the anode contact structure 314.

Figure 5E:
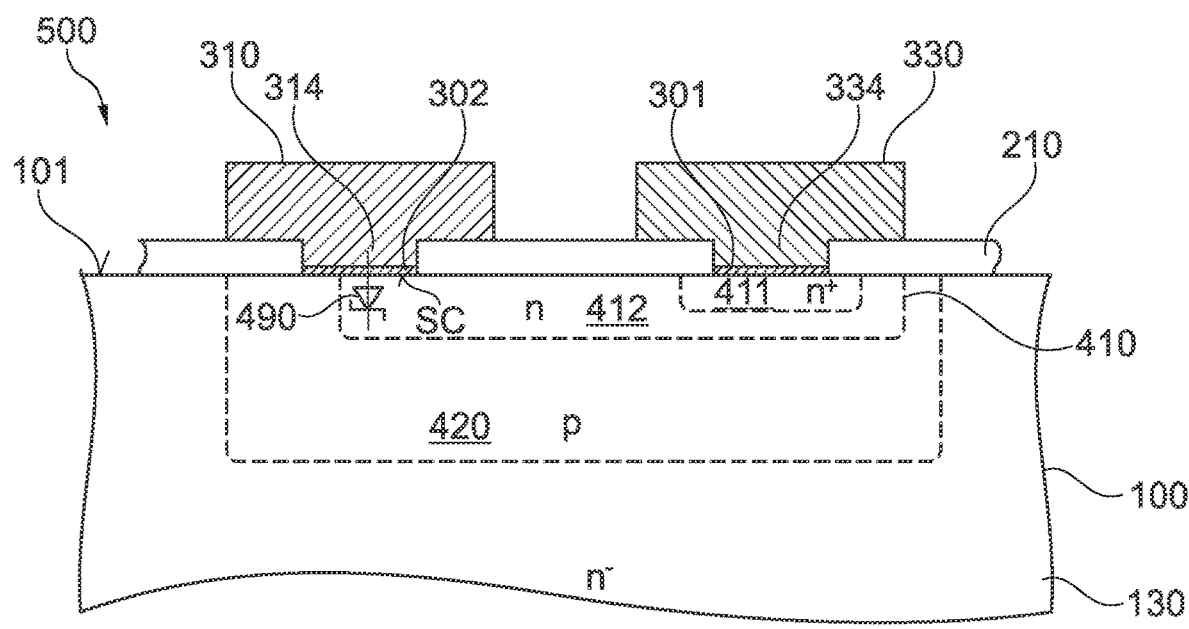

In FIG. 5E the rectifying junction 490 includes a Schottky contact SC between the source electrode 310 and the cathode region 410. The cathode region 410 may laterally extend from the cathode contact structure 334 to the anode contact structure 314. In some examples, the anode/separation region 420 laterally completely surrounds the cathode region 410.

The cathode region 410 may include a cathode contact portion 411 and a Schottky portion 412. The cathode contact portion 411 has a higher net dopant concentration than the Schottky portion 412. For example, the maximum net dopant concentration in the cathode contact portion 411 is at least ten times as high as a maximum net dopant concentration in the Schottky portion 412. The cathode contact portion 411 and the pad/wiring structure 330 form a low-resistive ohmic contact (e.g., an ohmic contact having a resistivity lower than a threshold resistivity). The Schottky portion 412 and the anode contact structure 314 form a Schottky contact SC. The anode contact structure 314 may include a Schottky anode layer 302 in direct contact with the Schottky portion 412. The anode contact structure 314 and the anode/separation region 420 may form an ohmic contact.

FIGS. 6A to 7B illustrate first rectifying junctions 491 formed between the edge of a gate pad 332 and the edge of a source pad 312 as illustrated in FIG. 4.

The silicon carbide body 100 includes a plurality of insulated gate transistor cells TC as described with respect to FIGS. 3A and 3B formed along parallel trench gate structures 150 as described with respect to FIG. 4. The insulated gate transistor cells TC may be from the single-sided channel type with transistor channels forming only along first longitudinal gate sidewalls 151. Along each second longitudinal gate sidewall 152, a p conducting shielding region 140 extends from the first main surface 101 to below the trench gate structure 150. The shielding region 140 in contact with a first trench gate structure 150 and the body region 120 in contact with a neighboring second trench gate structure 150 form a unipolar junction.

According to an embodiment (not illustrated) the insulated gate transistor cells TC may be from the double-sided channel type with transistor channels forming on both longitudinal gate sidewalls. Along a direction perpendicular to the cross-sectional plane, sections including body regions and source regions may alternate with sections including p conducting shielding regions extending from the first main surface 101 to below the trench gate structures 150.

The drain/drift region 130 includes a lightly doped drift zone 131 for accommodating a blocking voltage. The drift zone 131 is a layered structure that may extend across the complete or across almost the complete horizontal cross-section of the silicon carbide body 100. A vertical extension of the drift zone 131 and the doping concentration in the drift zone 131 govern the voltage blocking capability of the semiconductor device 500. The drain/drift region 130 may further include a heavily doped contact portion 139. The contact portion 139 and a drain electrode 320 may form a low-resistive ohmic contact (e.g., an ohmic contact having a resistivity lower than a threshold resistivity).

Source contact structures 311 of the source pad 312 extend through contact openings in the interlayer dielectric 210 to or into the silicon carbide body 100. The source contact structures 311 and the source regions 110 form low-resistive ohmic contacts (e.g., ohmic contacts having a resistivity lower than a threshold resistivity). The source contact structures 311 and the shielding regions 140 form low-resistive ohmic contacts (e.g., ohmic contacts having a resistivity lower than a threshold resistivity).

The shielding region 140 closest to the gate pad 332 or at least a portion thereof may be effective as the anode contact portion 421 of an anode/separation region 420. The contact structure closest to the gate pad 332 may form an anode contact structure 314.

A junction portion 422 of the anode/separation region 420 may vertically extend from the first main surface 101 into the silicon carbide body 100. The junction portion 422 may laterally extend from the shielding region 140 closest to the gate pad 322 to below the gate pad 322. A bottom edge of the junction portion 422 and a bottom edge of the body regions 120 may have the same distance to the first main surface 101. The junction portion 422 and the body region 120 may have the same or almost the same vertical dopant profile.

Figure 6A:
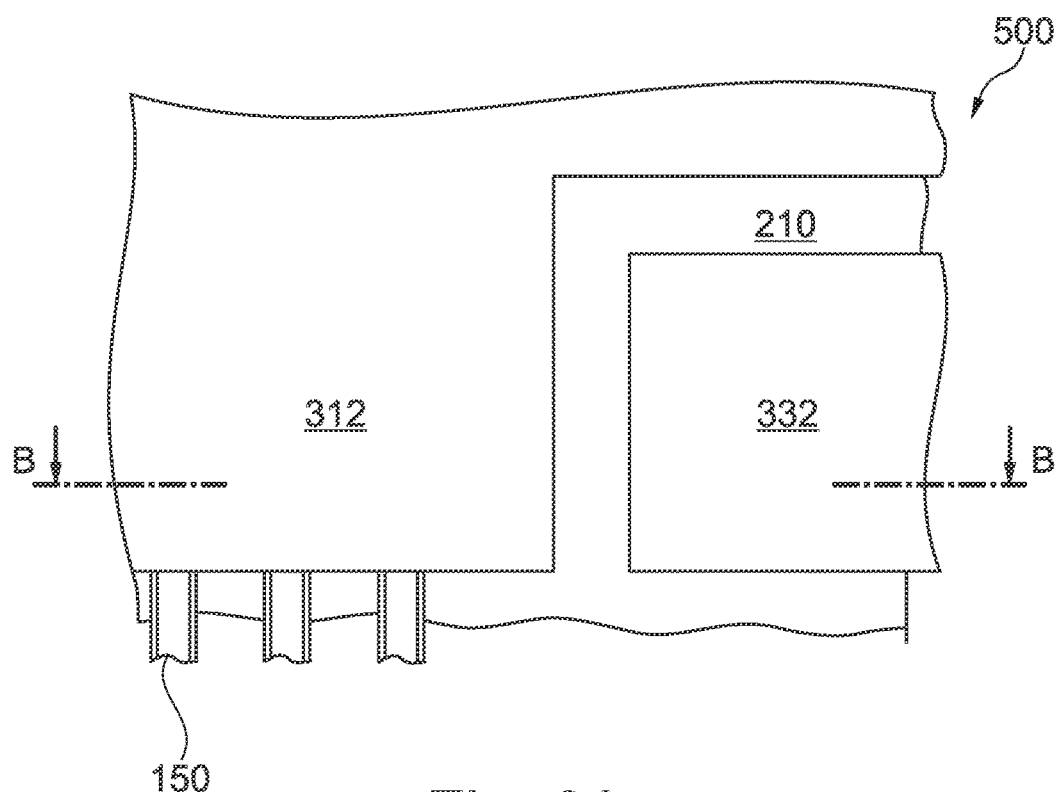
FIGS. 6A-6B show a simplified plan view and a corresponding simplified vertical cross-sectional view of a portion of a semiconductor device according to an embodiment related to a rectifying junction formed below a gate pad.
Figure 6B:
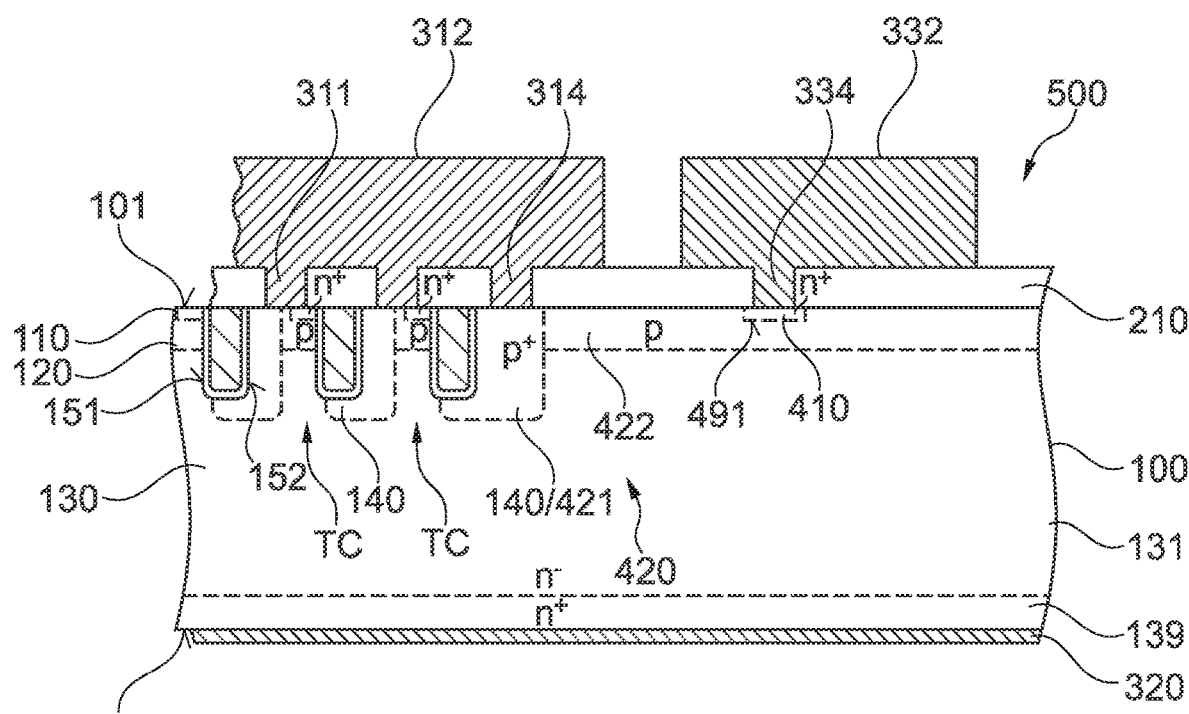

In FIGS. 6A and 6B, a cathode region 410 extends below the gate pad 332 from the first main surface 101 into the junction region 422. The gate pad 332 includes a cathode contact structure 334 that extends through a contact opening in the interlayer dielectric 210 and that is in direct contact with the cathode region 410.

Figure 7A:
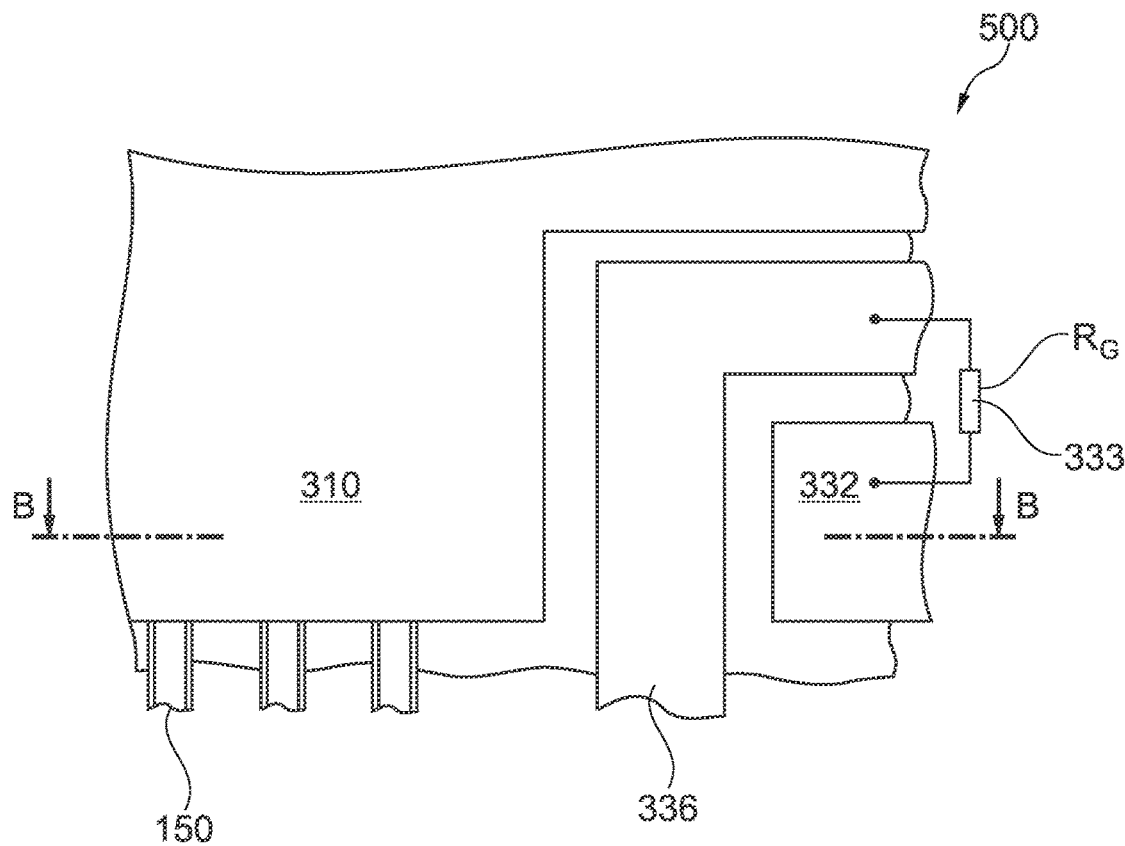
FIGS. 7A-7B show a simplified plan view and a corresponding simplified vertical cross-sectional view of a portion of a semiconductor device according to an embodiment related to a rectifying junction formed next to a gate pad.
Figure 7B:
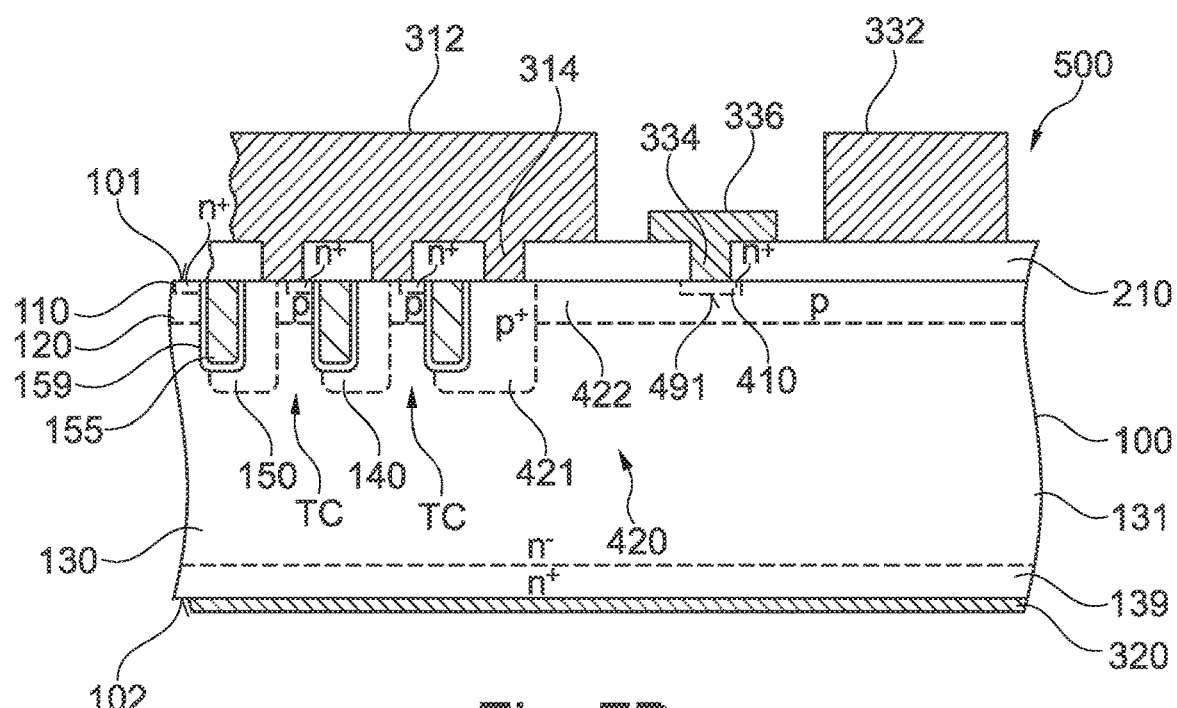

In FIGS. 7A and 7B, a portion of a gate wiring 336 is formed in a gap between the source pad 312 and the gate pad 332. The gate wiring 336 is thinner than the gate pad 332. An integrated gate resistor 333 may be electrically connected between the gate pad 332 and the gate wiring 336. A cathode region 410 extends below the gate wiring 336 from the first main surface 101 into the junction region 422. The gate wiring 336 includes a cathode contact structure 334 extending through a contact opening in the interlayer dielectric 210 to or into the silicon carbide body 100. The cathode contact structures 334 and the cathode regions 410 form low-resistive ohmic contacts (e.g., ohmic contacts having a resistivity lower than a threshold resistivity).

FIGS. 8A to 9C illustrate a second rectifying junction 492 formed along a gate finger $336_2$ as illustrated in FIG. 4. The gate structures 150 are stripe-shaped trench gates arranged in parallel. The insulated gate transistor cells TC may be from the single-sided channel type as described with respect to FIGS. 6A-7B.

The gate finger $336_2$ is formed in a gap between two neighboring sections of a source pad 312. A vertical extension of the gate finger $336_2$ is smaller than a vertical extension of the source pad 312. The gate finger $336_2$ may cross the gate structures 150 orthogonally. The gate finger $336_2$ and the gate electrodes 155 are in direct contact.

A gate layer portion of the gate finger $336_2$ may be formed on the interlayer dielectric 210. The gate finger $336_2$ may include metal gate contact structures 335 extending from the gate layer portions to or into the gate electrode 155. Alternatively, a surface portion of the gate dielectric 159 formed directly on the first main surface 101 and forming a sublayer of an interlayer dielectric 210 may partly separate the gate finger $336_2$ and the silicon carbide body 100.

The body regions 120 of the insulated gate transistor cells TC laterally extend from below a first section of the source pad 312 at a first side of the gate finger $336_2$ to below a second section of the source pad 312 at an opposite second side of the gate finger $336_2$, respectively. Portions of the body regions 120 between the two neighboring source pad sections may be effective as junction portion 422 of an anode/separation region 420 as described above.

Figure 8A:
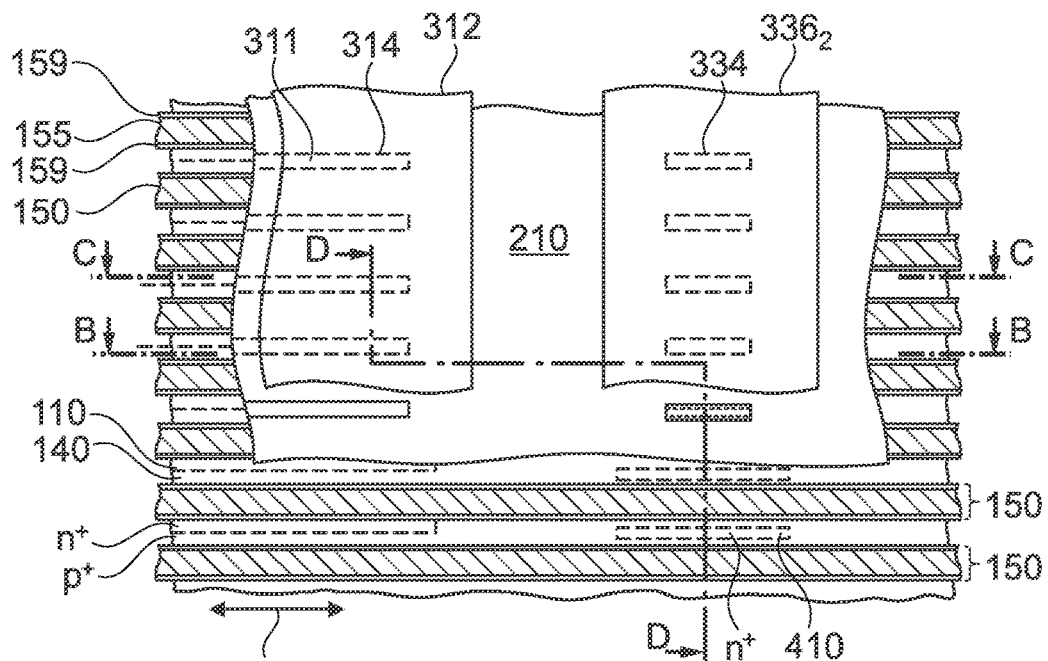
FIGS. 8A-8D show a simplified plan view and three corresponding simplified vertical cross-sectional views of a portion of a semiconductor device according to an embodiment related to a rectifying junction formed below a gate runner.
Figure 8B:
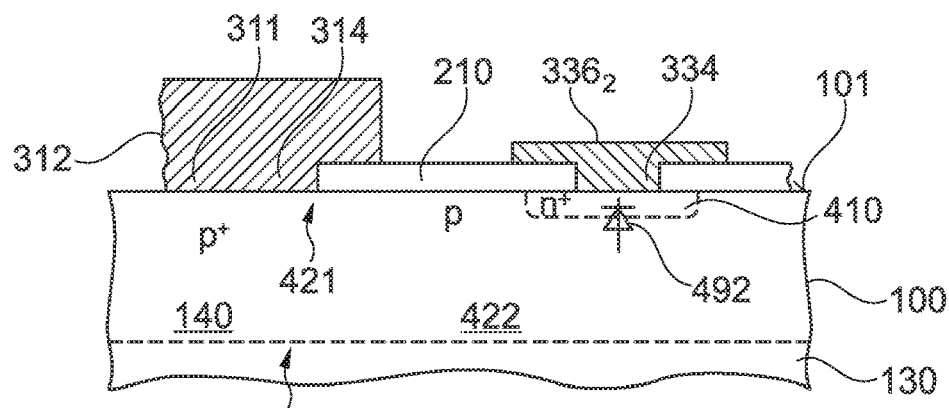
Figure 8C:
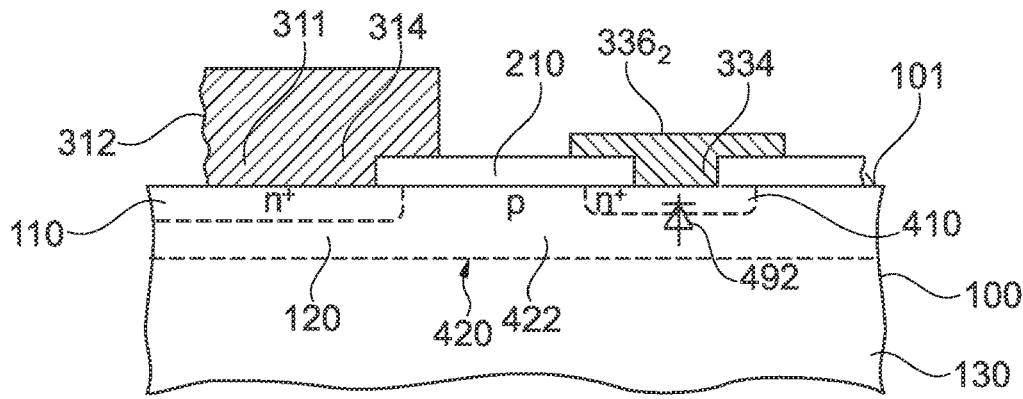
Figure 8D:
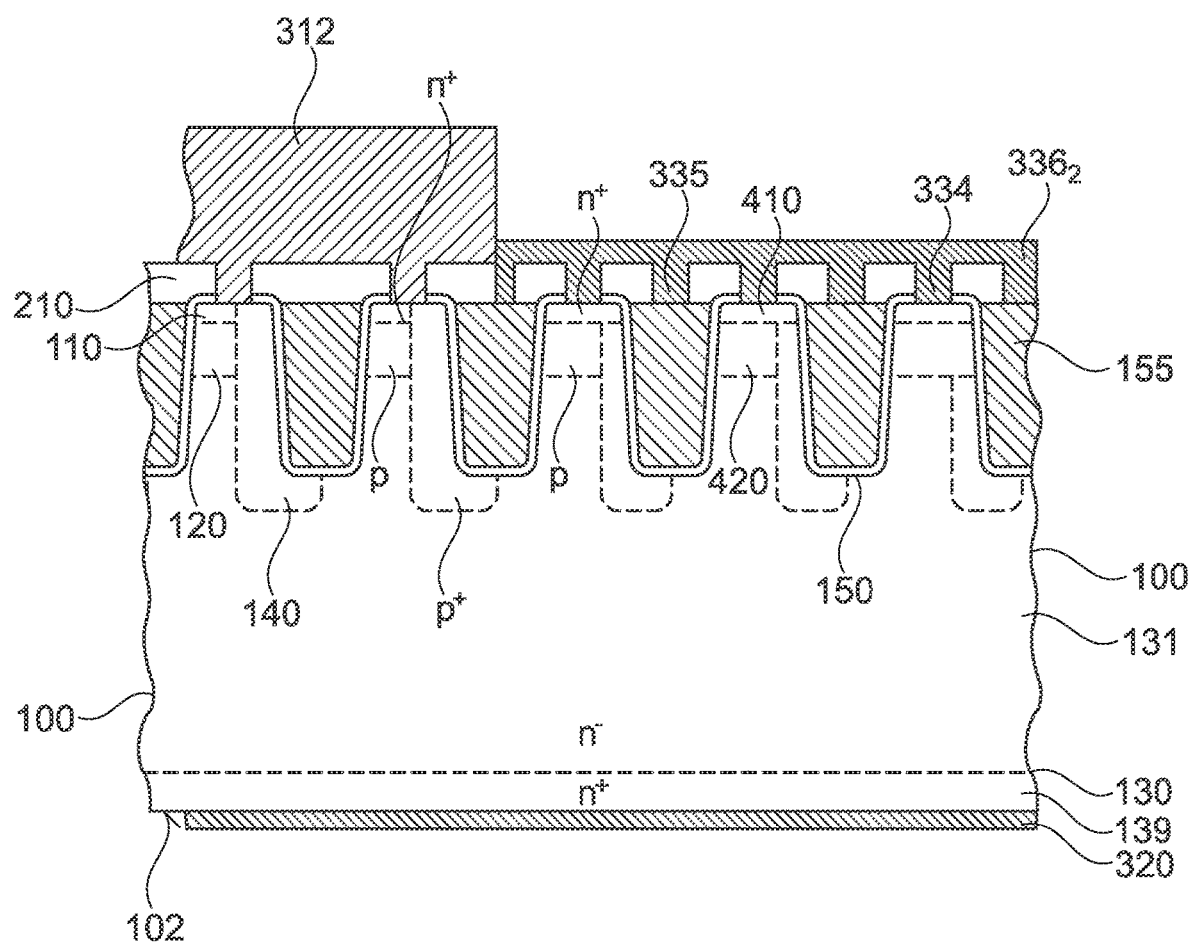

Shielding regions 140 of the insulated gate transistor cells TC may laterally extend from below the first source pad section to below the second source pad section or may be absent below the gate finger $336_2$ as illustrated in FIG. 8B.

Source regions 110 of the insulated gate transistor cells TC may be formed exclusively below the source pad 312, e.g. below the source pad sections on both sides of the gate finger $336_2$.

Below the gate finger $336_2$, cathode regions 410 extend from the first main surface 101 into the junction regions 422 of the anode/separation regions 420. Each cathode region 410 may be formed in a lateral center of a mesa portion of the silicon carbide body 100 between neighboring trench gate structures 150. Alternatively, the cathode region 410 may extend from one trench gate structure 150 to the neighboring trench gate structure 150. Alternatively, the cathode region 410 may be formed at a position in the mesa portion and with a width orthogonal to the first direction 291 equal to that of the source regions 110.

The gate finger $336_2$ may include cathode contact structures 334 extending through the interlayer dielectric 210 and being in direct contact with the cathode regions 410 through the cathode contact structures 334. Alternatively, the gate finger $336_2$ may be in direct contact with the cathode regions 410 through contact openings in the gate dielectric surface portion, wherein portions of the gate finger $336_2$ in the contact openings form the cathode contact structures 334.

The semiconductor device 500 shown in FIGS. 8A to 8D may include long stripe-shaped source contact structures 311. Along the lateral first direction 291 each source contact structure 311 may be as long as, longer than or shorter than the source region 110. Between two neighboring gate structures 150 one single source contact structure 311 is formed between two neighboring gate fingers $336_2$. Each source contact structure 311 forms an ohmic contact with a source region 110 and forms an ohmic contact with a shielding region 140. A section of the source contact structure 311 oriented to the gate finger $336_2$ is also effective as anode contact structure 314. A corresponding section of the shielding region 140, which is in direct contact with the section of the source contact structure 311 effective as anode contact structure 314, may be also effective as anode contact portion 421 as described with reference to FIG. 5B.

According to an embodiment (not illustrated), a plurality of short source contact structures 311 is formed per source region 110 instead of one single, long source contact structure 311. The source contact structure 311 next to the gate finger $336_2$ is also effective as anode contact structure 314. A corresponding section of the shielding region 140, which is in direct contact with the source contact structure 311 effective as anode contact structure 314, may be effective as anode contact portion 421.

Figure 9A:
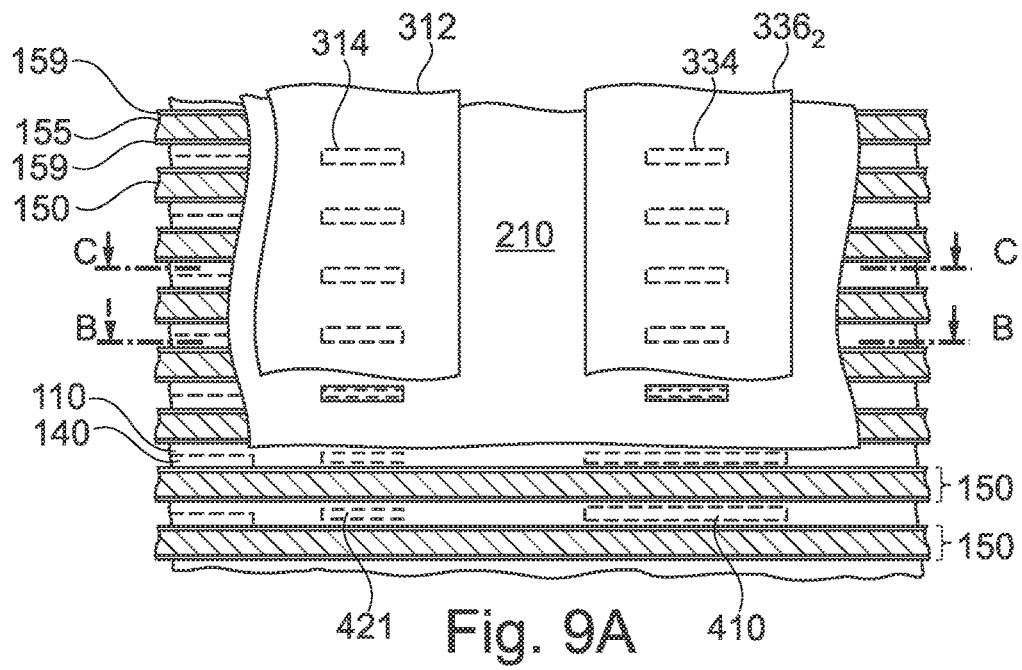
FIGS. 9A-9C show a simplified plan view and two corresponding simplified vertical cross-sectional views of a portion of a semiconductor device according to an embodiment related to a rectifying junction formed below a gate runner.
Figure 9B:
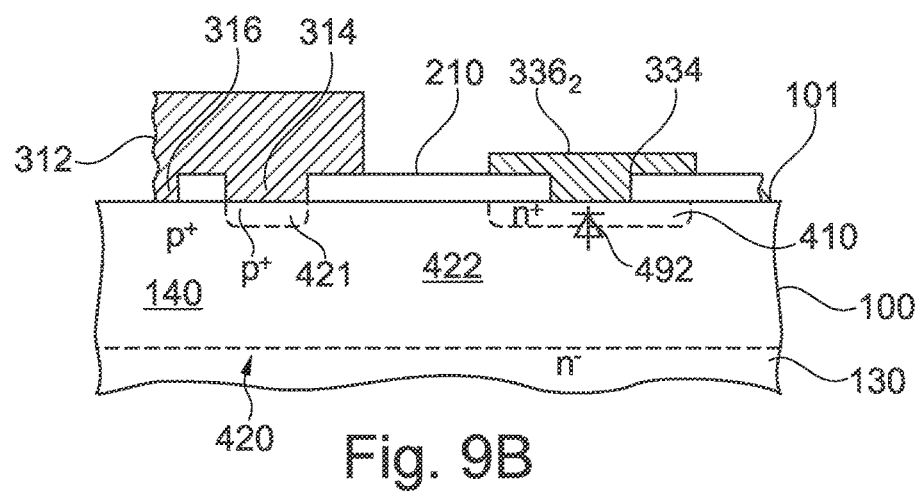
Figure 9C:
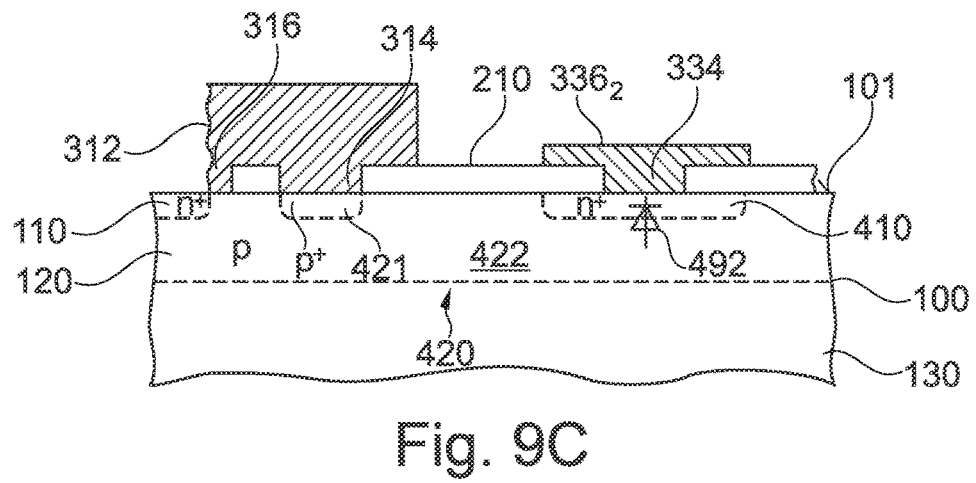

FIGS. 9A to 9C show dedicated anode contact structures 314 formed in addition to source contact structures 311. Anode contact regions 421 extend from the first main surface 101 into a portion of the body region 120 which may be effective as junction region 422. The dedicated anode contact structures 314 and the anode contact regions 421 form low-resistive ohmic contacts (e.g., ohmic contacts having a resistivity lower than a threshold resistivity). Each anode contact region 421 may be laterally separated from a neighboring shielding region 140 and/or may be laterally separated from a neighboring source region 110. The anode contact region 421 may be shallower than the shielding region 140.

According to an embodiment, a semiconductor device includes an insulated gate transistor cell, a source electrode, a cathode region and a rectifying junction. The insulated gate transistor cell includes a source region and a gate electrode. The source region is formed in a silicon carbide body. The source electrode and the source region are electrically connected. The cathode region is formed in the silicon carbide body. The cathode region and the source region have a first conductivity type. The gate electrode and the cathode region are electrically connected. The rectifying junction is electrically coupled between the source electrode and the cathode region. The semiconductor device may include further features and structures as described above.

For illustration, various scenarios have been described with respect to transistor cells with stripe-shaped transistor cells and single-sided transistor channel. Similar techniques may be implemented in semiconductor devices based on other types of transistor cells, e.g. square or polygonal transistor cells or transistor cells with stripe-shaped transistor cells and double-sided transistor channel.

For illustration, various scenarios have been described with respect to a silicon carbide device. Similar techniques may be implemented in semiconductor devices based on other kinds and types of semiconductors material for the silicon carbide body, e.g., silicon (Si), germanium (Ge), silicon germanium (Site), gallium nitride (GaN) or gallium arsenide (GaAs), etc.

Also for illustration, various techniques have been described with respect to MOSFETs. Similar techniques may be implemented in other kinds and types of semiconductor devices with insulated gate transistor cells such as MGDs (metal oxide semiconductor gated diodes) and IGBTs (insulated gate bipolar transistors), such as RC-IGBTs (reverse conducting IGBTs).

What is claimed is:

1. A semiconductor device comprising:
   an insulated gate transistor cell comprising a source region and a gate electrode, wherein the source region is in a silicon carbide body;
   a first region of a first conductivity type, wherein the first region comprises at least one of a drain region or a drift region;
   a cathode region in the silicon carbide body, wherein:
   the cathode region and the source region have the first conductivity type; and
   the gate electrode and the cathode region are electrically connected;
   a second region, of a second conductivity type, between the cathode region and the first region, wherein the second region comprises at least one of an anode region or a separation region; and
   a source electrode, wherein:
   the source electrode and the source region are electrically connected;
   the source electrode and the second region are in direct contact with each other; and
   a rectifying junction is electrically coupled between the source electrode and the cathode region.

2. The semiconductor device according to claim 1, wherein: the source electrode and the second region form an ohmic contact.

3. The semiconductor device according to claim 1, wherein:
   the cathode region extends from a first surface of the silicon carbide body into the second region.

4. The semiconductor device according to claim 1, comprising:
   a first structure positioned at a front side of the silicon carbide body, wherein:
   the first structure comprises at least one of a pad structure or a wiring structure;
   the first structure and the gate electrode are electrically connected; and
   the first structure and the cathode region are electrically connected.

5. The semiconductor device according to claim 4, wherein:
   the first structure comprises a gate pad, an integrated gate resistor and a gate wiring; and
   the integrated gate resistor is at least one of electrically connected or electrically coupled between the gate pad and the gate wiring.

6. The semiconductor device according to claim 5, wherein:
   the gate wiring is in direct contact with the cathode region and with the gate electrode.

7. The semiconductor device according to claim 4, comprising:
   a supplementary diode structure at least one of between the first structure and the cathode region, or between the source electrode and the second region, wherein the supplementary diode structure comprises polycrystalline semiconductor material.

8. The semiconductor device according to claim 1, wherein:
   the cathode region and the source region have a same vertical net dopant concentration profile.

9. The semiconductor device according to claim 1, wherein:
   the cathode region and the second region form a pn junction and the pn junction forms at least part of the rectifying junction.

10. The semiconductor device according to claim 1, wherein: the second region comprises an anode contact portion and a junction portion; the anode contact portion has a higher net dopant concentration than the junction portion; the anode contact portion and the source electrode form an ohmic contact; and the junction portion and the cathode region form a pn junction.

11. The semiconductor device according to claim 1, comprising: a blocking region of the second conductivity type, wherein: the blocking region is between the first region and the cathode region; and a first mean net dopant concentration in the blocking region is higher than a second mean net dopant concentration in the second region.

12. The semiconductor device according to claim 1, wherein:
   the rectifying junction comprises a Schottky contact comprising the source electrode and the cathode region, wherein the cathode region of the Schottky contact is electrically connected to the gate electrode of the insulated gate transistor cell.

13. The semiconductor device according to claim 12, comprising:
   a first structure positioned at a front side of the silicon carbide body, wherein:
   the first structure comprises at least one of a pad structure or a wiring structure;
   the first structure and the gate electrode are electrically connected;
   the first structure and the cathode region are electrically connected;
   the cathode region comprises a cathode contact portion and a Schottky portion;
   the cathode contact portion has a higher net dopant concentration than the Schottky portion;

the cathode contact portion and the first structure form an ohmic contact; and the Schottky portion and the source electrode form the Schottky contact.

14. A semiconductor device comprising:

an insulated gate transistor cell comprising a source region and a gate electrode, wherein the source region is in a silicon carbide body;

a first region of a first conductivity type, wherein the first region comprises at least one of a drain region or a drift region;

a cathode region in the silicon carbide body, wherein:
the cathode region and the source region have the first conductivity type; and
the gate electrode and the cathode region are electrically connected;

a second region, of a second conductivity type, between the cathode region and the first region, wherein:
the second region comprises at least one of an anode region or a separation region; and
the cathode region extends from a first surface of the silicon carbide body into the second region; and a source electrode, wherein:
the source electrode and the source region are electrically connected;
the source electrode and the second region are in direct contact with each other;
the source electrode and the second region form an ohmic contact; and
a rectifying junction is electrically coupled between the source electrode and the cathode region.

15. The semiconductor device according to claim 14, comprising:

a first structure positioned at a front side of the silicon carbide body, wherein:
the first structure comprises at least one of a pad structure or a wiring structure;
the first structure and the gate electrode are electrically connected; and
the first structure and the cathode region are electrically connected.

16. The semiconductor device according to claim 15, wherein:

the first structure comprises a gate pad, an integrated gate resistor and a gate wiring; and
the integrated gate resistor is at least one of electrically connected or electrically coupled between the gate pad and the gate wiring.

17. The semiconductor device according to claim 16, wherein:

the gate wiring is in direct contact with the cathode region and with the gate electrode.

18. The semiconductor device according to claim 15, comprising:

a supplementary diode structure at least one of between the first structure and the cathode region, or between the source electrode and the second region, wherein the supplementary diode structure comprises polycrystalline semiconductor material.

19. The semiconductor device according to claim 14, wherein:

the cathode region and the source region have a same vertical net dopant concentration profile.

20. A semiconductor device comprising:

an insulated gate transistor cell comprising a source region and a gate electrode, wherein the source region is in a silicon carbide body;

a first region of a first conductivity type, wherein the first region comprises at least one of a drain region or a drift region;

a cathode region in the silicon carbide body, wherein:
the cathode region and the source region have the first conductivity type; and
the gate electrode and the cathode region are electrically connected;

a second region, of a second conductivity type, between the cathode region and the first region, wherein the second region comprises at least one of an anode region or a separation region;

a first structure positioned at a front side of the silicon carbide body, wherein:
the first structure comprises at least one of a pad structure or a wiring structure;
the first structure and the gate electrode are electrically connected; and
the first structure and the cathode region are electrically connected; and a source electrode, wherein:
the source electrode and the source region are electrically connected;
the source electrode and the second region are in direct contact with each other;
the source electrode and the second region form an ohmic contact; and
a rectifying junction is electrically coupled between the source electrode and the cathode region.

* * * * *